United States Patent [19]
Comeau

[11] Patent Number: 5,587,325
[45] Date of Patent: Dec. 24, 1996

[54] METHOD OF PREPARING ANTIMONY DOPED SEMICONDUCTOR WITH INTRINSIC GETTERING

[75] Inventor: Alain Comeau, Bromont, Canada

[73] Assignee: Mitel Corporation, Kanata, Canada

[21] Appl. No.: 313,091

[22] PCT Filed: Mar. 26, 1993

[86] PCT No.: PCT/CA93/00123

§ 371 Date: Sep. 30, 1994

§ 102(e) Date: Sep. 30, 1994

[87] PCT Pub. No.: WO93/20582

PCT Pub. Date: Oct. 14, 1993

[30] Foreign Application Priority Data

Mar. 31, 1992 [CA] Canada .................................. 2064486

[51] Int. Cl.⁶ .................................................. H01L 21/322
[52] U.S. Cl. ........................................... 437/10; 437/12
[58] Field of Search ............... 437/10, 12; 148/DIG. 60; 117/2

[56] References Cited

U.S. PATENT DOCUMENTS

| | | | |
|---|---|---|---|
| 4,548,654 | 10/1985 | Tobin | 437/10 |
| 4,597,804 | 7/1986 | Imaoka | 437/13 |
| 4,622,082 | 11/1986 | Dyson et al. | 148/DIG. 60 |
| 4,661,166 | 4/1987 | Hirao | 437/13 |
| 4,851,358 | 7/1989 | Huber | 437/12 |
| 5,141,887 | 8/1992 | Liaw et al. | 437/62 |
| 5,286,658 | 2/1994 | Shirakawa et al. | 437/10 |

FOREIGN PATENT DOCUMENTS

| | | | |
|---|---|---|---|
| 91178758 | 3/1987 | European Pat. Off. | 437/10 |
| 61-20337 | 1/1986 | Japan | 437/10 |
| 3-185831 | 8/1991 | Japan | 437/10 |
| 5-308076 | 11/1993 | Japan | 437/13 |

*Primary Examiner*—George Fourson
*Assistant Examiner*—S. Mulpuri
*Attorney, Agent, or Firm*—Marks & Clerk

[57] ABSTRACT

A method of preparing semiconductor wafers with intrinsic gettering capability, comprises the steps of: carrying out a high temperature wet oxidation on a doped semiconductor wafer for between about 20 to 60 minutes to form an initial oxidation layer; heating said wafer at a moderate temperature in an inert atmosphere for about 1 to 4 hours to initiate formation of crystal nuclei; ramping up the temperature in said inert atmosphere to a temperature of at least about 850° C. at a rate of about 1°–10° C./min.; and subsequently carrying out well diffusion on the wafer at a temperature of at least about 1000° C.

5 Claims, 24 Drawing Sheets

SMALL DEFECTS: NUMBER=15

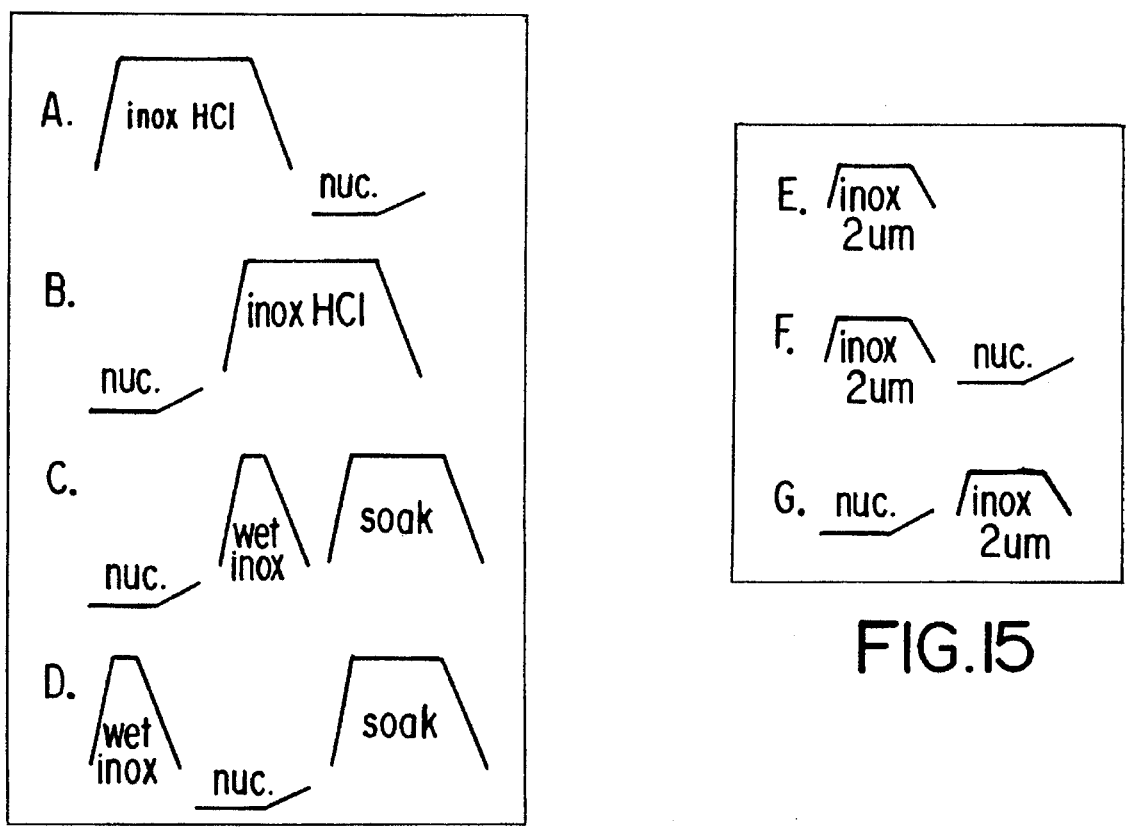
FIG.14
FIG.15
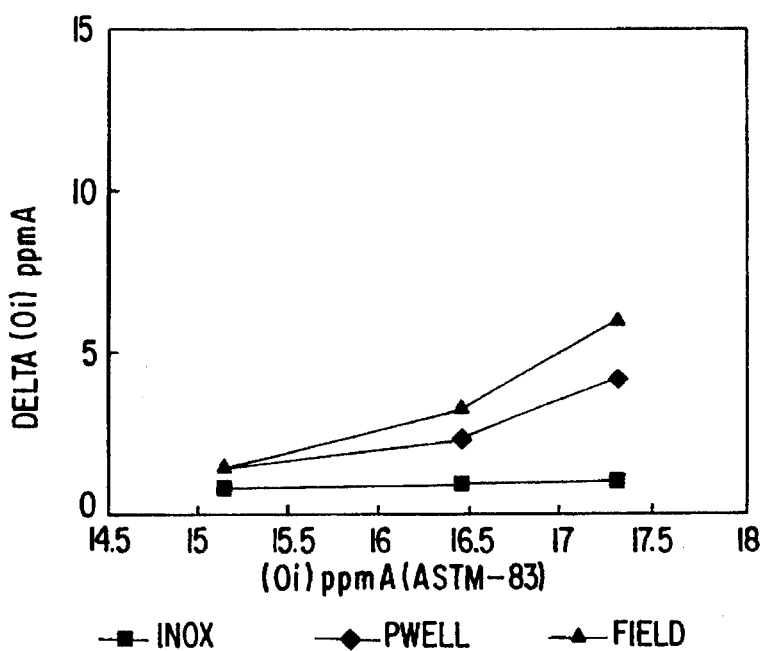
FIG.16

METHOD OF PREPARING ANTIMONY DOPED SEMICONDUCTOR WITH INTRINSIC GETTERING

BACKGROUND OF THE INVENTION

This invention relates to a method of preparing semiconductor wafers with good intrinsic gettering capability for use in CMOS devices, especially highly antimony-doped epitaxial wafers.

Metallic contaminants in semiconductor substrates kill minority carriers, causing latch-up in bulk wafers and adversely affecting oxide and diode integrity in epitaxial wafers. It is therefore important to remove such contaminants from the substrate. This can be achieved by a process known as intrinsic gettering, which involves deliberately creating defects in the crystal lattice by incorporating oxygen atoms in the crystal. The oxygen atoms combine with the silicon in the lattice to form $SiO_2$ nuclei. These create the crystal defects, which act as traps for the metallic contaminants.

In practice, it has been found difficult to get oxygen to precipitate in antimony-doped wafers because the antimony retards the oxygen precipitation.

Intrinsic gettering in substrates highly doped with antimony, which are used for epitaxial wafers, is of major importance, especially for ensuring gate oxide and diode integrity. Efforts have been made to achieve good gettering in N/N$^+$ antimony doped epitaxial wafers [See, for example, J. O. Borland, and T. deacon, (Solid State Technology, Aug. 123 (1984)], but such efforts have generally been hampered by the oxygen retardation [See, T. Nozaki and Y. Itoh, J. Appl. Phys., 59, 2562 (1986)]. while some mathematical models explain the oxygen retardation effect on the basis of electrical effects within the crystal, more recently it has been observed that crystal doped with tin, which has a similar ion size to antimony, does not exhibit this oxygen retardation behaviour. This suggests that the retardation is not caused solely by the large size of the antimony ions, as had previously been thought.

One method for achieving significant oxygen precipitation generally in silicon wafers is to grow oxygen nuclei or clusters at low temperatures (500°–800° C.) prior to processing at higher temperatures where oxygen precipitation occurs. At low temperatures, nucleation is easier because of the lower thermal energy available to break up the $SiO_2$ nuclei as they form. At higher temperatures, oxygen diffusion increases and, for nuclei above a critical size, which depends on the temperature, growth occurs faster. Nuclei below the critical size tends to shrink due to the increased thermal energy to break up the bonds. Typical nucleation cycles are carried at a constant temperature (650°–750° C.) for fairly long time (8–48 h.). This method is not proved very effective for antimony doped wafers, and the long heat treatment induces warping in the wafer, which is highly detrimental to LSI processes.

Long treatment times at the low temperature (650° C.) are required to produce enough nuclei above the critical size for growth during subsequent high temperature annealing. Kishino [S. Kishino et al., J. of Appl. Phys., 23, L9, 1984]showed that for lightly doped wafers the low temperature treatment time can be reduced by employing a nucleation growth (NG) cycle, wherein a treatment is first carried out at 650° C. for about 2 hrs. followed by a treatment wherein the temperature is ramped up to about 900° C. over a period of 1 to 2 hrs. By ensuring that the rate of increase of the critical site was lower than the growth rate of the nuclei, Kishino was able to obtain high defect densities without long cycle times.

Kishino carried out the NG cycle after an initial denuding treatment at 1200° C. for 3 hrs. He did not address the problem of oxygen retardation that occurs in highly doped antimony wafers.

SUMMARY OF THE INVENTION

An object of the invention is to provide a method of preparing semiconductor wafers with improved gettering properties, especially wafers highly antimony-doped epitaxial wafers.

In accordance with the present invention a high temperature treatment is first carried out in on a semiconductor wafer for between about 20 to 60 minutes to form an initial oxidation layer on said wafer. The wafer is then heated at a moderate temperature in an inert atmosphere for about 1 to 4 hours to initiate crystal nuclei formation. The nuclei are then grown by ramping up the temperature at a rate of between about 1° and 10° C./min, preferably 10° to about 3° C., to a temperature of at least about 850° C. Subsequently well diffusion is carried out at temperature of at least about 1000° C.

The wafer can be a silicon wafer highly doped with antimony. Best results are obtained if during activation the oxidation is wet ($H_2/O_2$) rather than dry ($O_2$).

The moderate temperature can be about 600°–700° C., preferably 650° C. The temperature is preferably ramped up to a temperature of about 900° to 1000° C. and the well diffusion carried out at a temperature of about 1175° C.

Activation temperature can be different from 1175° C., but needs to be above 1000° C. The time spent at the activation temperature can vary, but the optimum time is around 35 min.

Ramp rates can be to be as much as about 10° C./min, but from about 5° C./min, different activation temperatures are required.

The ramp part of the nucleation cycle need not be linear. For example, it can be parabolic. If the temperature increase is non-linear, the maximum ramp rate can be higher than 3° C./min. below 850° C.

The substrate can be doped with materials other than antimony. Indeed, the invention can be applied to elements other than oxygen and silicon, in which case the temperatures may vary.

Activation and nucleation need not be part of the same furnace cycle.

In a preferred embodiment the invention consists a brief activation (20–60 mins. oxidation at 1175° C.), a nucleation soak cycle (soak at 600°–700° C. for at least two hours), and a nucleation ramp cycle (linear increase in temperature from 600°–700° C. to at least 850° C. at a rate no faster than abour 3° C./min. It has been found that by following the initial wet oxidation treatment of short duration by a ramped wet oxidation treatment of short duration by a ramped nucleation growth cycle, a significant improvement in oxygen precipitation can be achieved bulk material, and good results can be obtained in epitaxial wafers, including antimony-doped epitaxial wafers.

Thus the method described permits the nucleation of interstitial oxygen in lighly or highly doped silicon (with antimony or other dopant).Within a reasonable time (about 6 hours). After nucleation, a high level of interstitial oxygen precipation can be achieved in the silicon during device fabrication.

BRIEF DESCRIPTION OF THE DRAWINGS

The invention will now be described in more detail, by way of example only, with reference to the accompanying drawings, in which:

FIG. 14 is a schematic representation of the splits for batch E9-8 for the three micron process. Wet inital oxidation was done at 1175° C.;

FIG. 15 is a schematic presentation of the splits of lot E9-8 for the 2 micron process with the initial oxide grown at 950° C;

FIG. 16 shows precipitatesd interstitial oxygen (DELTA $[O_i]$) for bulk wafers with nucleation after HCl initial oxidation as a function of initial $[O_i]$;

DETAILED DESCRIPTION OF THE INVENTION

Figure 1:
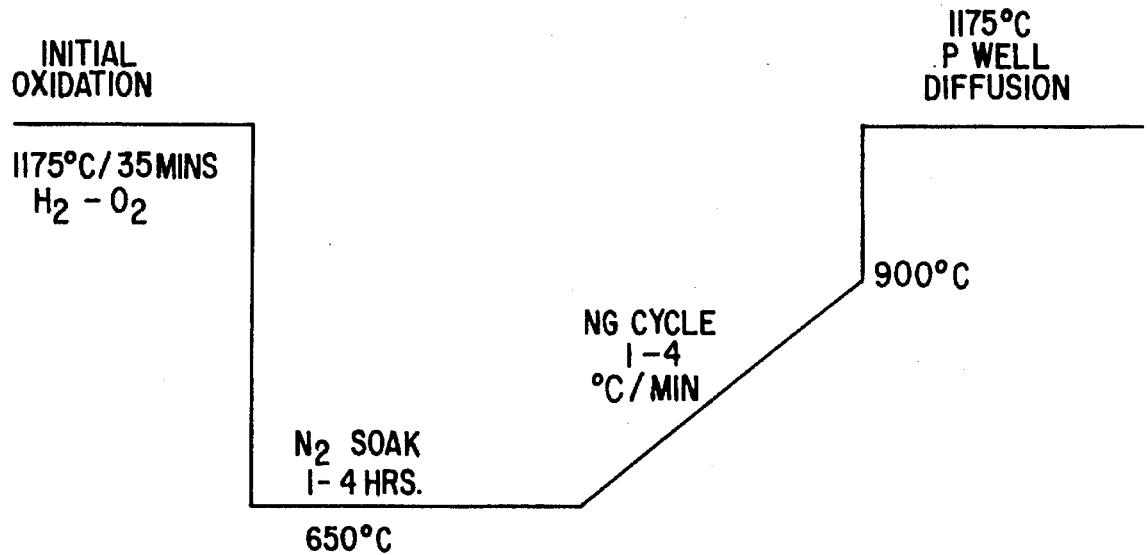
FIG. 1 is a program showing the process steps of a process in accordance with the invention.

Referring to the drawings, as shown in FIG. 1, the wafers, which can be highly antimony-doped epitaxial wafers, are first subjected to a wet oxidation at 1175° C. for 35 mins. This creates an initial oxidation layer.

In a second phase, the wafers are subjected to $N_2$ soak at 650° C. for 1–4 hrs. This soak causes formed $SiO_2$ nuclei to diffuse into the substrate.

In the next step, the temperature is ramped up 900° C. over about 2–10 hrs. to initiate nucleation growth, after which P well diffusion is carried out temperature of 1175° C. for about 400 mins. in the presence of oxygen.

EXAMPLE 1

One hundred 100 mm n–/n+ epitaxial wafers were used with substrates antimony-doped to 30–50 mΩcm. The epitaxial layer was lightly doped with phosphorus and nominally 10 microns thick. The oxygen content of each wafer was measured before any processing was done. All wafers were within 15.7–16.3 ppma (Atomic part per million) range (ASTM-F121–83). Carbon content was specified to be less than 1.0 ppmA. The substrate used for these wafers is somewhat less heavily doped than the usual antimony doped epitaxial substrate (8–15 mΩ cm), and this enabled the oxygen content to be measured by conventional infra-red techniques. Because of the lower doping level, some oxygen precipitation was been found to occur in similar substrates when long nucleation times are used.

In the example, the most important front end thermal cycles, namely, initial oxidation, nucleation-growth (NG), well, diffusion and field oxidation were carried cut in sequence. In an actual process subnitride oxidation and nitride deposition take place before field oxidation. Studies of the evolution of oxygen precipitation have shown that this difference is not significant for oxygen precipitation, even though nitride deposition is carried out at a temperature close to 800° C., at which interstitial oxygen may precipitate.

Nucleation-growth (NG) was carried out after initial oxide treatment (1175° C./3 min.) and before well diffusion (1175° C./400 min.). By contrast in Kishino, NG cycle was carried out after a treatment at 1200° C. for 3 hrs. and before a treatment at 1000° C. for 16 hrs. These differences in processing temperatures and times lead Oxygen nucleation is retarded if long times are spent at high temperatures before NG is carried out.

The following experimintal NG cycles were carried out.

The nitrogen soak was carried out at 650° C. for periods of 1 hr., 2hr., and 4hr. Ramping from 650° C. up to 900° C. or 1000° C. was tried with at 1.0° C./min., 2.0° C./min., and 4.0° C./min. Total cycle times were between 122.5 and 590 minutes. Two wafers were used per split.

Twelve wafers were also processed without an NG cycle to serve as references. Two of these wafers had a very high oxygen content, about 21 ppma.

TABLE 1

Total NG Cycle Time

| Ramp to 900° C. | | | |
|---|---|---|---|
| Soak @ 650° C. | 1.0 hr. | 2.0 hr. | 4.0 hr. |
| 4.0° C./min. | 122.5 | 182.5 | 302.5 |
| 2.0° C./min. | 185.0 | 245.0 | 365.0 |
| 1.0° C./min. | 310.0 | 370.0 | 490.0 |

| Ramp to 1000° C. | | | |
|---|---|---|---|
| Soak @ 650° C. | 1. hr. | 2.0 hr. | 4.0 hr. |
| 4.0° C./min. | 147.5 | 207.5 | 327.5 |
| 2.0° C./min. | 235.0 | 295.0 | 415.0 |
| 1.0° C./min. | 410.0 | 470.0 | 590.0 |

Wafer bow was measured using interferometry and the final interstitial oxygen content was measured by infrared spectrophotometry (ASTN-F121-83). Then the wafers were cleaved and were given a Wright etch for 1.0 minute to delineate surface and bulk defects. Phase contrast pictures of wafer sections were taken near the wafer centre to count bulk defects (precipitates, and stacking faults). Some pictures were also taken near the wafer edges for comparison.

Most often, gettering ability can be evaluated by any, of four methods: two indirect, one relative and one absolute. In this work the two indirect methods and the relative method were used. The two indirect methods consist in: measuring the amount of precipitated oxygen after simulated processing ($\Delta O_i$), and counting the number of bulk defects after preferential etching of a section. The relative method consists of processing a number of wafers with standard processing and wafers with experimental processing. Results from each split are then compared for gate oxide and/or diode integrity.

The absolute method consists of intentionally contaminating a sample and measuring the amount of electrically active contamination after processing. This method was not used in this experiment.

Figure 2:
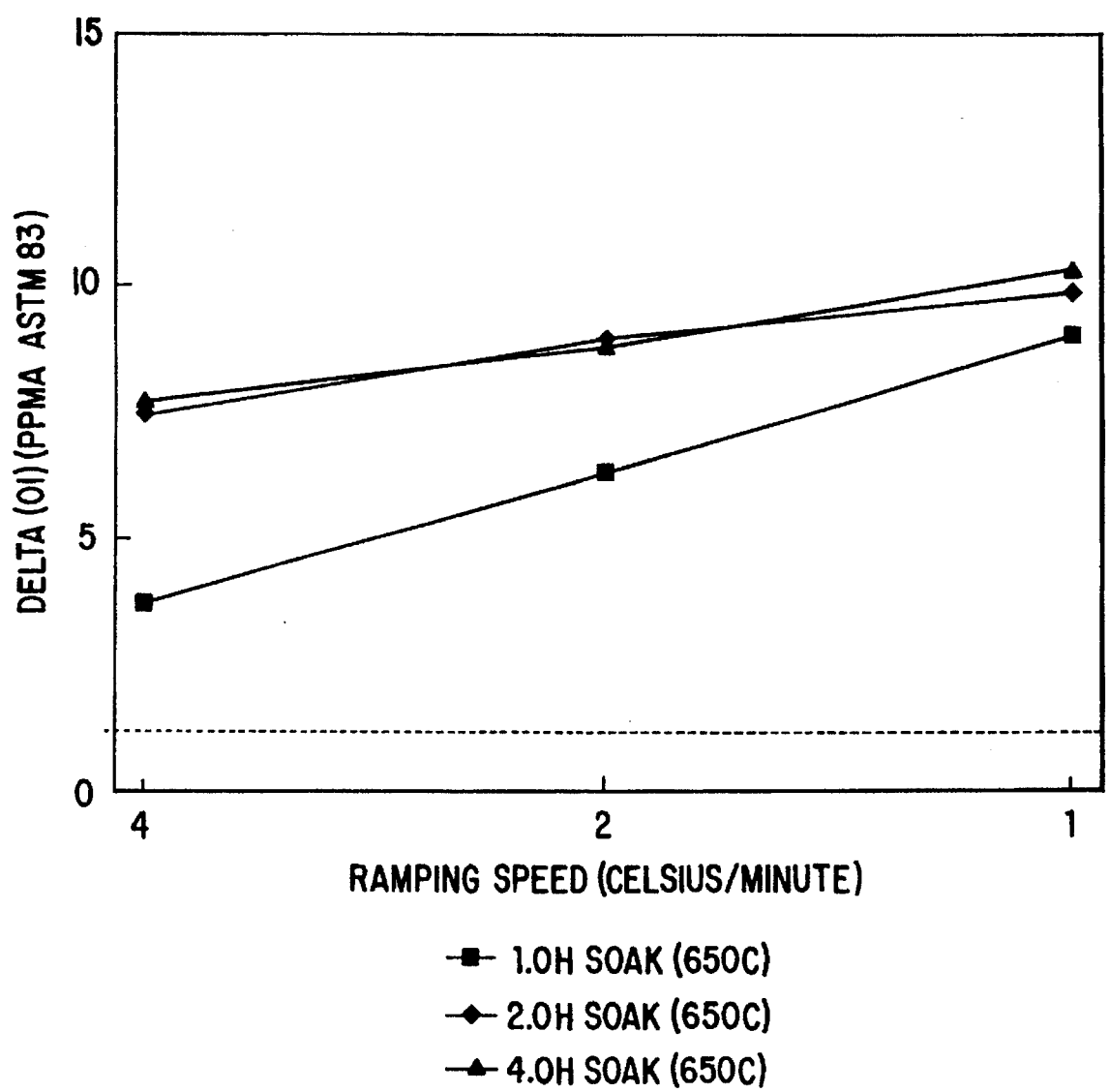
FIG. 2 is a chart showing the oxygen precipitation after ramping to 900° C.
Figure 3:
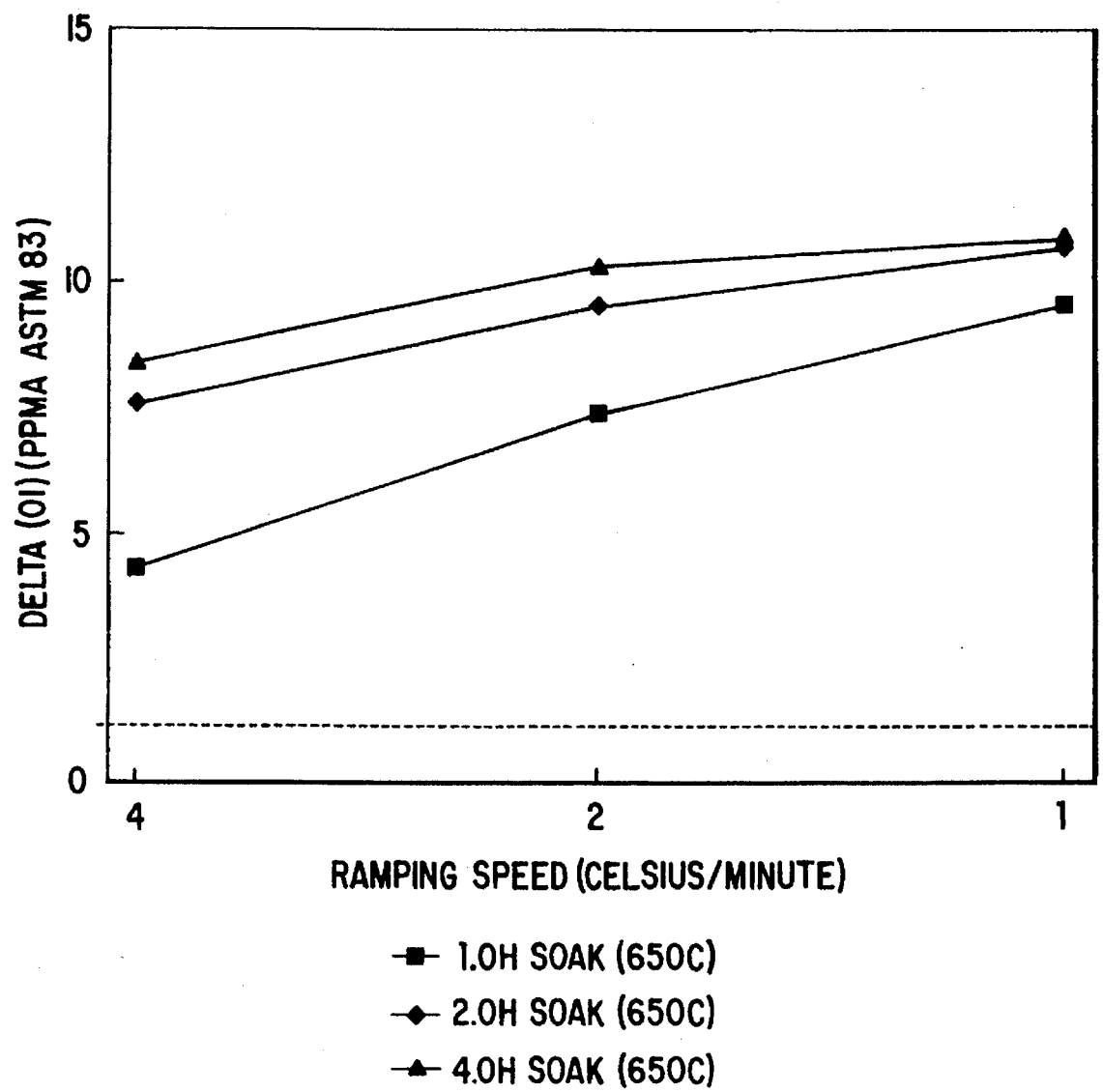
FIG. 3 is a chart showing the oxygen. precipitation after ramping to 1000° C.

Oxygen precipitation results are shown in FIG. 2, (ramping 900° C.) and FIG. 3 (ramping to 1000° C.). A change of 1.0 ppma in interstitial oxygen concentration was observed on wafers without NG (with identical initial oxygen content). Part of the interstitial oxygen loss is due to oxygen out diffusion (0.5 ppmA calculated). Ramping to 900° C. or to 1000° C. made little difference except when the ramping rate was 2.0 C/min., in which case ramping to 1000° C. yielded significantly higher oxygen precipitation for all three soak times.

The oxygen precipitation is significant in these epitaxial wafers. Each wafer used for NG had an initial oxygen content between 15.7 to 16.3 ppma (16.0 ppma will be assumed in the following discussion). The least amount of precipitation ($\Delta O_i$=3.5 ppma) observed with NG (1h/650° C. and 4.OC.°/min. ramp up to 950° C.) is about six times higher than the simulated process with no NG cycle (excluding oxygen outgassing).

Wafers with $O_i$=21 ppma which did not have NG showed $\Delta Oi$=4 ppma, which is comparable to the least amount of precipitation observed with NG. The greatest precipitation observed with NG ($\Delta O_i$=10.8 ppma) was obtained on wafers having a 4.0h. soak and ramping at 1.0° C./min. up to 1000° C. Such a level of precipitation page leaves a mere 5.2 ppma of interstitial oxygen in the wafer.

The solubility limit of oxygen at 1000° C. (Field oxidation) is about 2.6 ppma, and at 1175° C. (Well drive) is 8.2 ppmA. An interstitial oxygen residual level of 5.2 ppma indicates that some level of precipitation must occur during field oxidation for the described process (5.2 ppma is less than the 8.2 ppma predicted by the solubility limit at 1175C.). If this is the case, then precipitate growth must occur during P-wum diffusion. The maximum $\Delta O_i$ possible after well diffusion (400 min. @1175° C.) is 7.8 pA (solubility limit is 8.2 ppma). Preliminary step by step studies of precipitation confirm this hypothesis.

Precipitate growth during well diffusion probably slows down near $\Delta O_i$=7–8 ppma, because the interstitial oxygen concentration is very close to the solubility limit and because precipitation kinetics are strongly dependent on supersaturated $O_i$ concentration. This can explain the saturation effect observed in FIG. 3 for slower ramp rates. It also explains why curves for different soak times seem to converge to about 11 ppma (maximum $\Delta O_i$ after field oxidation). Once all the curves are merged together, the increase could continue asymptotically to $\Delta O_i$ maximum, about 13.4 ppma, if more time was spent at 1000° C.

In the process sequence used here no significant time is spent at temperatures below 900° C. without an NG cycle. Such low temperatures (600° C.–800° C.) cause oxygen nucleation. This indicates that precipitation is controlled by a low temperature mechanism (nucleation) under the conditions used here. It has been shown that heterogeneous nucleation can also be enhanced by subjecting the wafer to a high temperature (1280° C.) before nucleation, presumably by point defect clusters. In the case studied here, such a mechanism is also conceivable because a high temperature (1175° C.) cycle precedes nucleation.

In order to estimate the most efficient use of furnace time versus oxygen precipitation, calculations of the ratio of oxygen precipitation to the square root of extra furnace time were carried out. The results are shown in Table 2.

TABLE 2

Optimum NG Cycle Analysis

| | Ramp to 900° C. | | |
|---|---|---|---|
| Soak @ 650° C. | 1.0 hr. | 2.0 hr. | 4.0 hr. |
| 4.0° C./min. | 23 | 37 | 44 |
| 2.0° C./min. | 46 | 49 | 45 |
| 1.0° C./min. | 38 | 40 | 41 |
| | Ramp to 1000° C. | | |
| Soak @ 650° C. | 1. hr. | 2.0 hr. | 4.0 hr. |
| 4.0° C./min. | 25.5 | 39 | 40 |
| 2.0° C./min. | 42 | 47 | 43 |
| 1.0° C./min. | 39 | 44 | 39 |

The square root of time is arbitrarily used because extra time is less important, in this case, than the end result, precipitation of oxygen. According to Table 2, the cycle which provides the optimum ratio of oxygen precipitation to the square root of extra furnace time is 2h. at 650° C. and 2.0° C./min. ramp-up to 900° C.

The standard method used to estimate the bulk defect density assumes that: (i) exactly 1.0 micron of silicon was etched; (ii) the sample picture area ($3.0 \times 10-3 cm^2$) is representative of the wafer; and (iii) that the defects are smaller than 1.0 micron. The exact thickness of silicon removed is only of relative importance because all the wafers are etched at the same time and are expected to have seen the same etch rate. On the other hand, the assumption that the measured area is representative of the wafer, is not rigorous. To avoid the effect of systematic spatial distribution pictures were always taken near wafer centre. The last assumption, that defects are smaller than 1.0 micron, is valid for oxygen precipitates that have been shown to be typically less than 2000A, but not for bulk stacking faults (BSF). The standard defect density calculation does not take into account the size of BSF). This will be shown later to lead to significant differences in interpretation.

To understand a more about bulk defects, pictures of wafer sections following a 1.0 minute Wright etch were taken. Most of the visible defects at this scale were found to be bulk page stacking faults (BSF). A highly non-uniform distribution of bulk defects was observed in wafers with an initial oxygen content of about 20 ppma and not subjected to an NG cycle as a result of the initial non-uniform spatial distribution of heterogeneous nucleation centres. In the wafers with NG the distribution of bulk defects is very uniform across the wafer.

Figure 4:
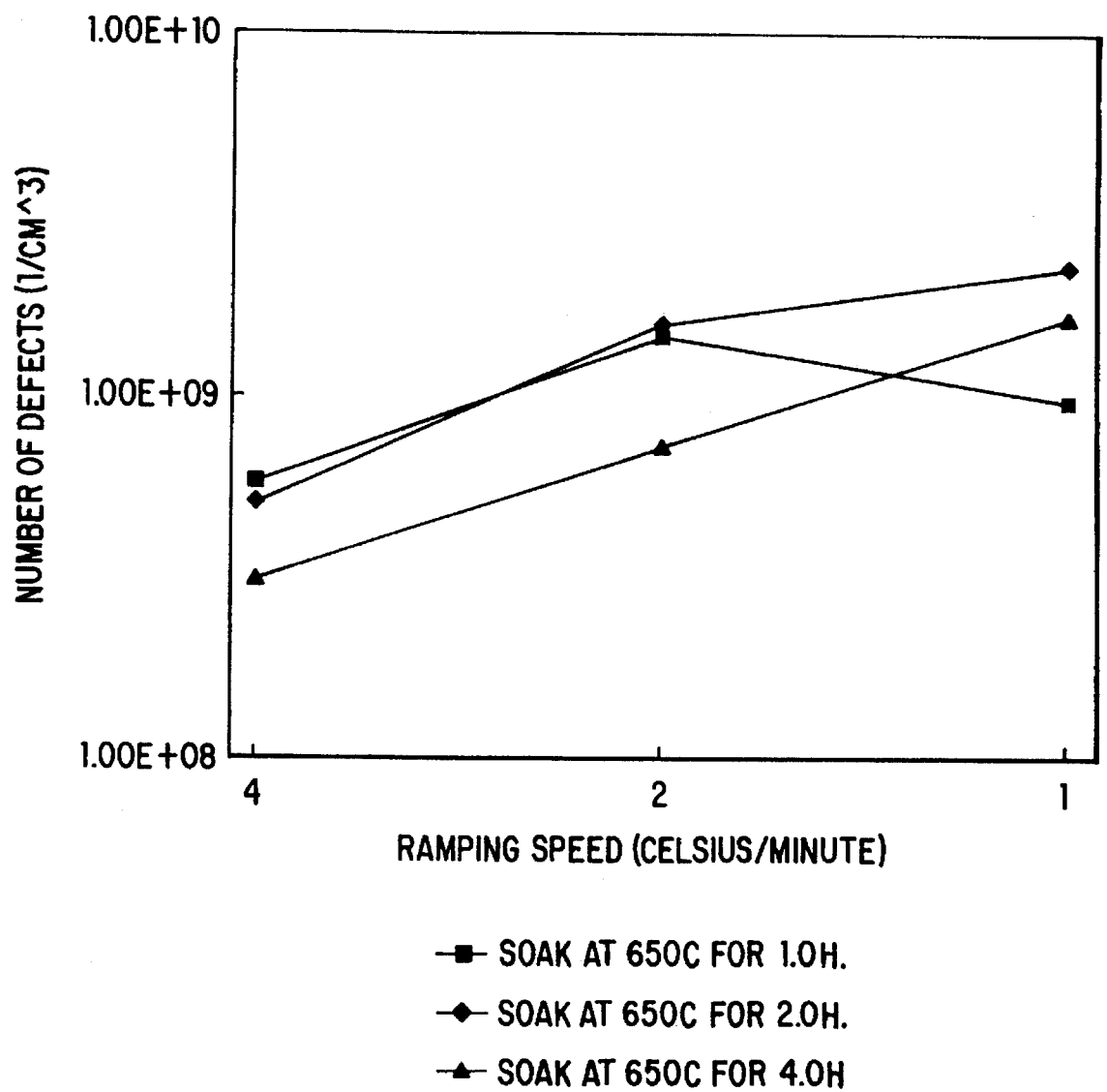
FIG. 4 is a chart showing the number of bulk defects after a ramp up to 900° C.
Figure 5:
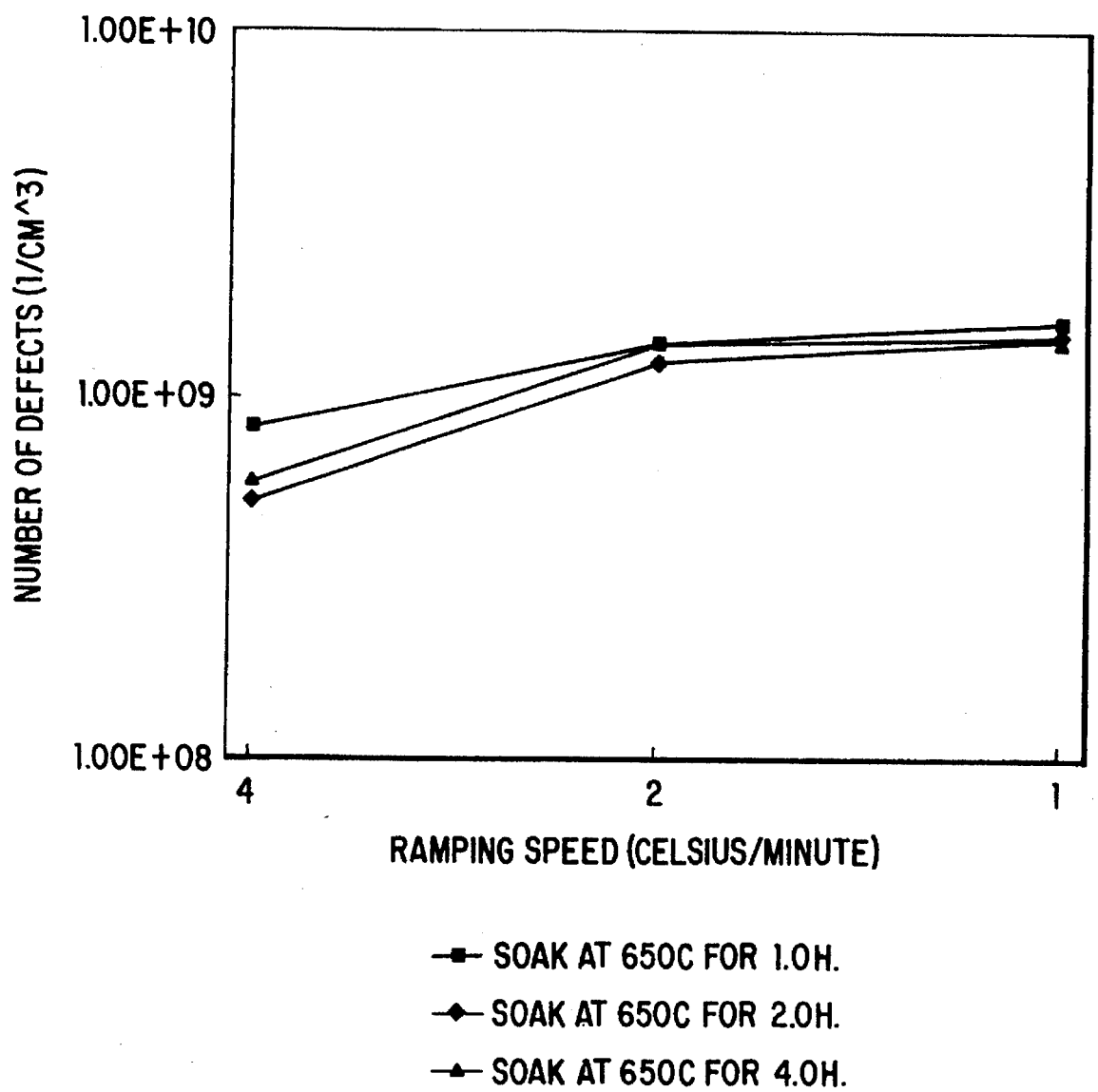
FIG. 5 is a chart showing the number of bulk defects after a ramp up to 1000° C.

Using the standard method of calculation, the curves, as shown in FIGS. 4 and 5, were found to flatten for ramp rates of 1.0° C./min. A very unexpected effect is that higher defect densities are observed for wafers which have been subjected to 1.0h. $N_2$ soak at 650° C.

An interesting feature of the results observed is the range of different numbers and sizes of the defects seen. Pictures taken at higher magnification revealed more details about the bulk page defects in wafers which had slower ramp rates. The most visible defects are small BSF and their number is very large. In addition to small BSF (5–7 lim), larger BSF (15–25 PM) can be observed (see FIG. 5 ) near the beginning of the denuded zone. When NG with faster ramp rate to 900° C. (FIG.10) is used, numerous small defects (likely to be oxygen precipitates) and some stacking faults of larger size (15–20 Pm), are observed. Again here, even larger BSF are located near the beginning of the denuded zone.

Figure 6A:
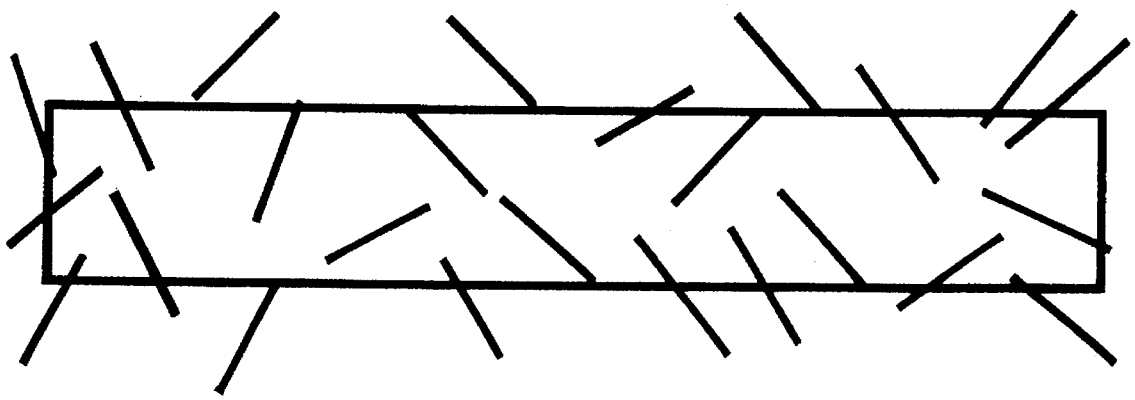
FIG. 6 is a diagram showing the finite size effect when counting defects from an etched section.
Figure 6B:
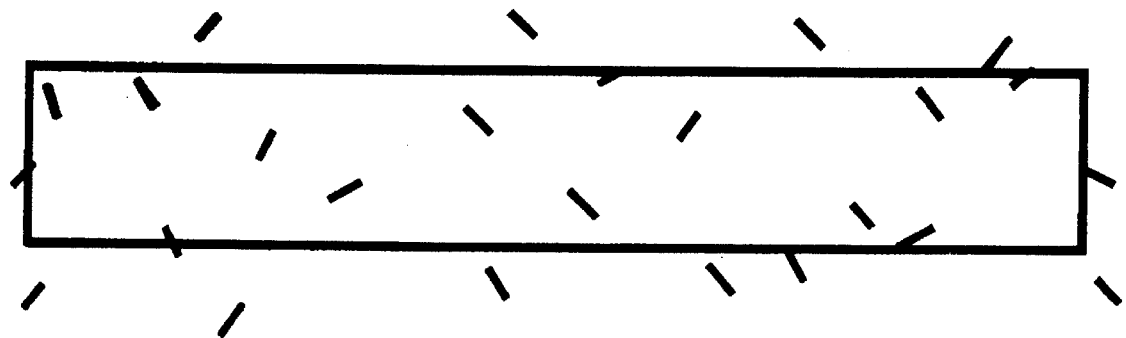

When defect densities were computed, it was assumed that defects were much smaller than the thickness of silicon etched (1.0 μm) . If this is not the case then the number of defects is over-estimated. FIG. 6 shows the number of defects that cut the horizontal line or which are in the etched volume. These defects appear after a preferential etch. The smaller defects show a smaller count. As shown in FIG. 6, defects which have their centres out of the etched silicon layer, but extend in this layer, will appear after the etch. In many pictures defects much larger than 1 micron are observed. In particular, this is the case for most bulk stacking faults.

This detrimental effect can be compensated by assuming that; (i) all BSF in the observed area have the same real length (w); (ii) all BSF observed are circular in (111) planes (23); (iii) the thickness of silicon etched (1) is exactly 1.0 micron; and (iv) the observed average BSF length is $\overline{W}=\pi/4$. Under these assumptions, the volume that is considered for defect density calculation (V) is given by $$V=(1+4\overline{w}/\pi) \qquad [1]$$

$$D=n/V \qquad [2]$$

and is strongly dependent on defect size. This volume considers defects of length w located within the interval [−w., 1+w]from the original surface (S) to be visible in all cases.

Equation 2 permits an accurate calculation of the defect density (D) knowing the number of defects (n) of average size w. It was observed that the Wright etch failed to identify clearly BSF which intersected the cleavage plane (110) parallel to the 100 surface. This is rather unusual, and is still unexplained. To correct for this effect and because only two of the four possible BSF orientation were observed, the number of BSF observed (n) was multiplied by 2.

Figure 7:
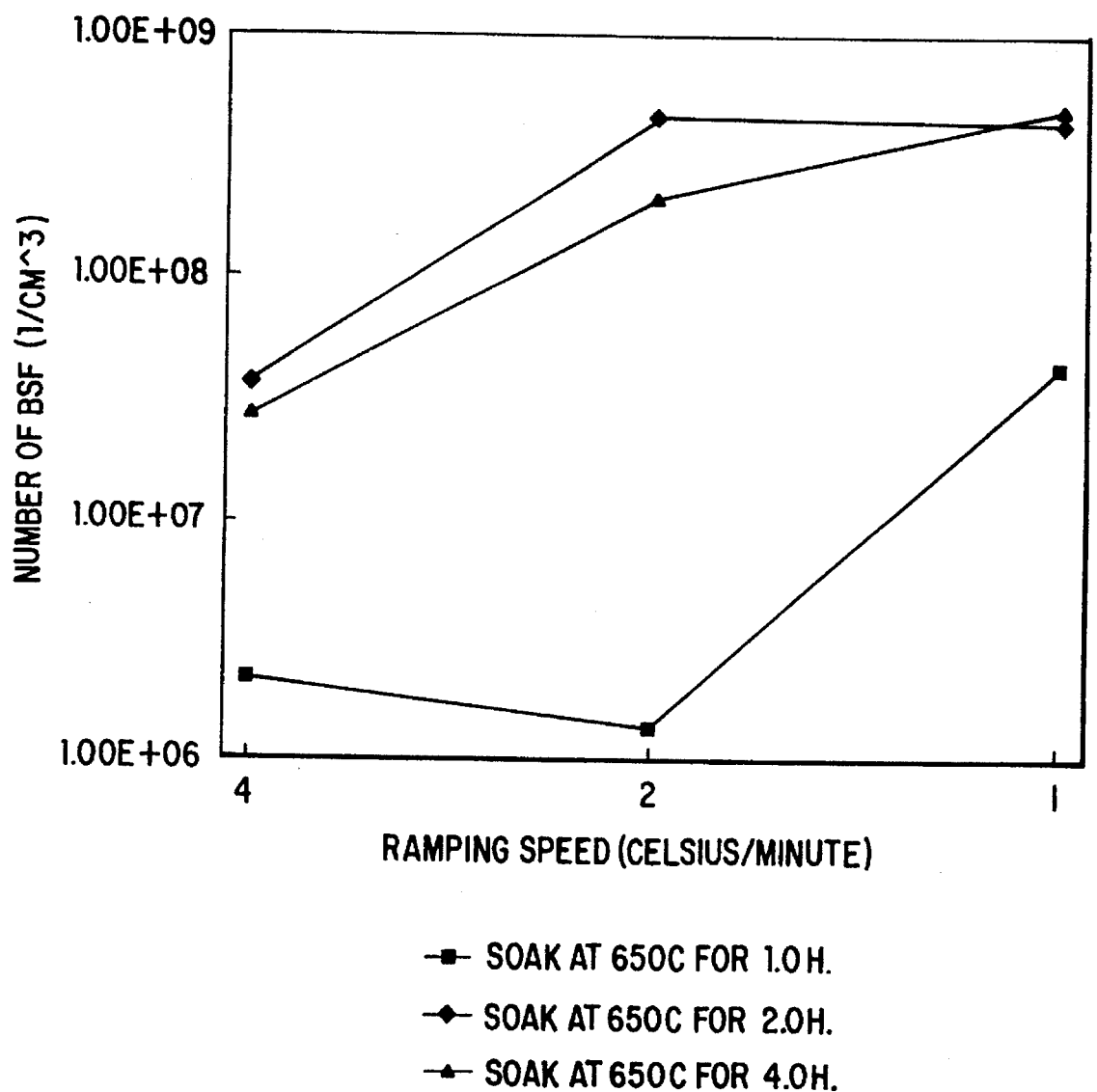
FIG. 7 shows the number of bulk stacking faults different combinations of nucleation growth cycles after ramping to 900° C.
Figure 8:
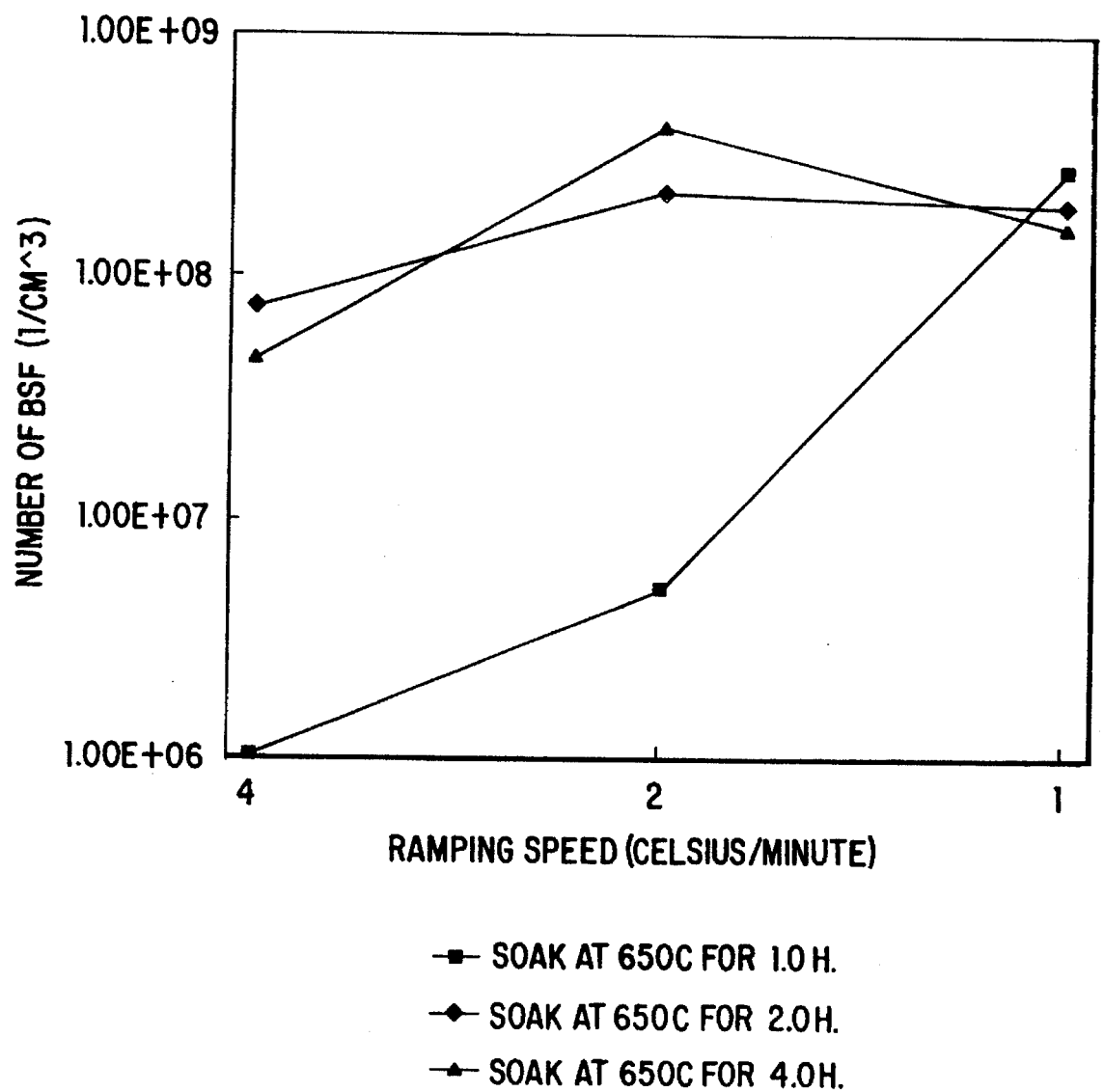
FIG. 8 shows the number of bulk stacking faults per unit volume corrected for bulk stacking fault size for different combinations of nucleation growth cycles after ramping to 1000° C.

FIGS. 7 and 8 show the corrected BSF density for wafers which had 1.0h., 2.0h. or 4.0h. soak at 650° C. The defect density in these figure is at least half an order of magnitude less than those calculated using the standard. Also, variations from split to split seem more consistent with oxygen precipitation data. In particular, wafers with shorter soak time at 650° C exhibit fewer BSF. From FIGS. 7 and 8, it appears that a soak of at least 2. hrs. is required to consistently give a large BSF density. This is in agreement with results found from oxygen precipitation experiments (FIGS. 2 and 3).

From the above observations, it is clear that neglecting defect size when evaluating defect density leads to erroneous conclusions.

It is believed that a possible explanation for the observed BSF size correlation with BSF density is that BSF growth reaction is limited by the supply of reactants (interstitial silicon). In this case BSF volume is inversely proportional to defect density. This would explain why BSF seen on wafers having a slower ramp rate (higher BSF density) are smaller. The fact that larger BSF are observed near the beginning of the denuded zone is different, and can be explained by the larger supply of interstitial silicon from surface oxidation during well diffusion and field oxidation.

When the following conditions exist: (i) defects are two dimensional (like extrinsic BSF); (ii) the supply of reactant (Si$x$) is the growth limiting factor; and (iii) defect size is narrowly distributed, The relationship between average defect size and defect density (D) is governed by a quadratic power law $$D = K\sqrt{\overline{W^2}} \qquad [3]$$

where K is a proportionality constant given by $$K = \pi N_i C_i / 4 \qquad [4]$$

where $N_i$ is the number of $Si_I$ generated per unit volume;
CI is the increase in BSF surface caused by the addition of $Si_I$ in the extra 111 plane.

Figure 9:
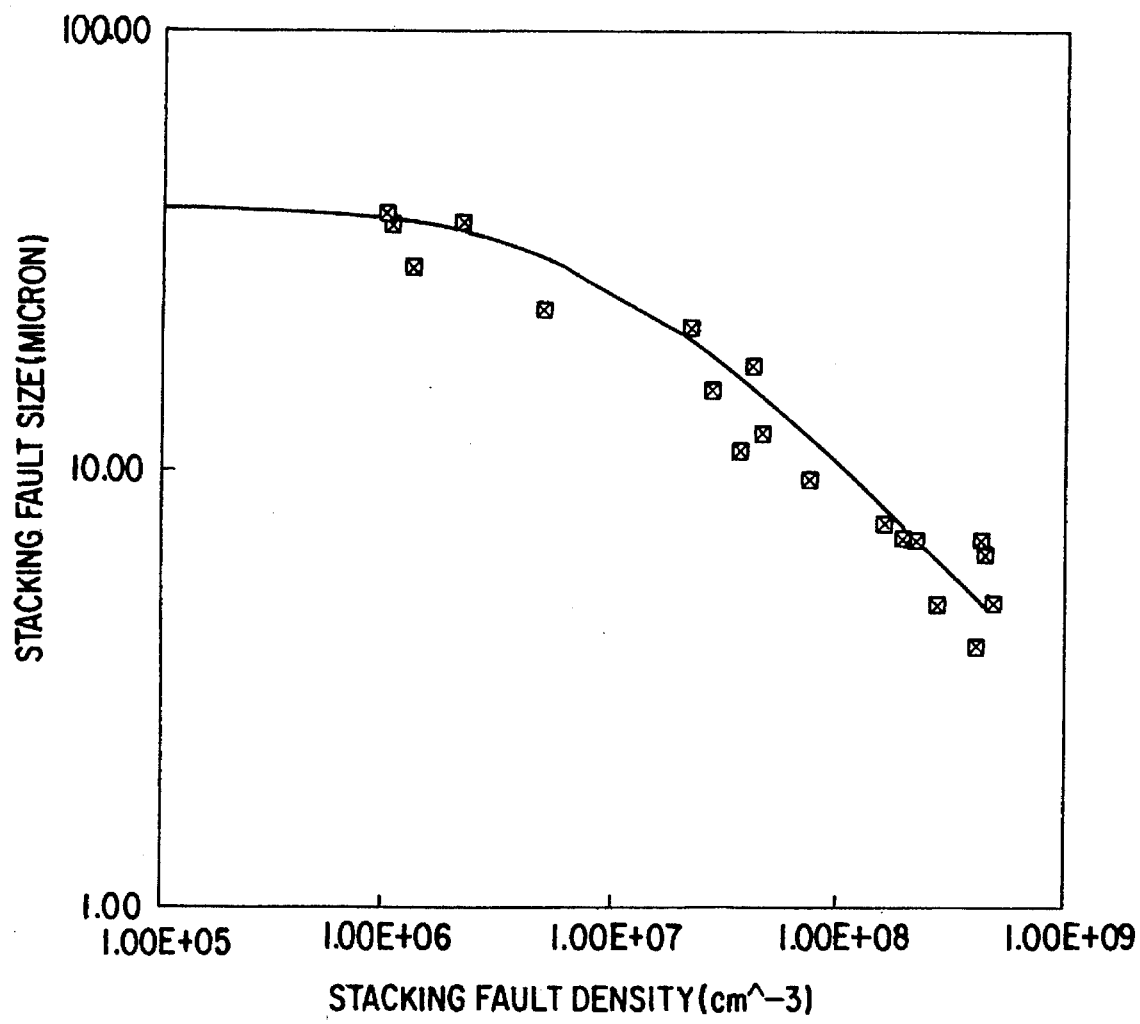
FIG. 9 shows the correlation between stacking fault size and density corrected for defect size.

The relation between defect size and defect density shown by Equation 3 is strong. FIG. 9 shows the observed relationship between BSF density and size for the same wafers as in FIGS. 7 and 8. The BSF density was calculated with the corrected method, taking into account BSF size. Although some spread in the data points is observed, a negative square law dependence at high defect density fits the data very well, as expected from Equation [3].

FIG. 9 also shows the expected defect size saturation at low defect density. This indicates that in wafers with actual BSF density below 10$^7$ cm$^{-3}$ the supply of interstitial silicon is not the factor limiting BSF growth, but in this case $Si_I$ capture is the limiting factor. Wafers processed without NG show a BSF length of about 40 μm. This is the maximum length which can be achieved for the growth time allowed. For wafers without NG, the density is small, typically about 10$^5$–10$^6$ cm$^{-3}$.

Assuming that (i) a BSF is composed of an extra 111 plane (extrinsic stacking fault); (ii) the increase in BSF area caused by the addition of an interstitial silicon atom (C,) is the inverse of the number of atoms per unit area in a 111 plane, e.g. 5.21×10$^{-16}$ cm$^2$/atom; (iii) that BSF growth occurs during the well drive. Using the slope of FIG. 9 at densities above 10$^7$ cm$^{-3}$ (K =112cm-1 ), the total number of $Si_I$ generated per unit volume ($N_I$) can be calculated at 1175° C.

$$N_i = 4 K/(\pi Ci) = 2.7 \times 10^{17} Si / cm^3 \qquad [5]$$

The total number of interstitial silicon atoms generated can also be calculated from the quantity of precipitated interstitial oxygen. The general form of the growth reaction of oxygen precipitates is given by Equation (6). Where $Si_v$, are silicon vacancies; y, the average number of vacancies used to accommodate lattice space; $O_i$ is interstitial oxygen; and $Y_2$ is the average number of interstitial silicon atoms ejected to accommodate lattice space.

$$(1+Y_1+Y_2)Si+2O_i+Y_1Si_v \Leftrightarrow SiO_2+Y_2Si_I \qquad [6]$$

Assuming that: (i) volume accommodation is mainly associated with Si, emission (this is supported by the presence of BSF); (ii) interstitial oxygen solubility limit is achieved during well diffusion ($\Delta O_i = \Delta O_i max = 7.8$ ppma); (iii) volumetric requirement for SiO$_2$(quartz) is 2.25 times that of crystalline silicon, for one Si atom, then the total number of $Si_I$ generated by oxygen precipitation (R,) is given by $$\overline{N}_I = \Delta O_i (2.25-1)/2 = 2.4 \times 10^{17} Si_I / cm^3 \qquad [7]$$

The value obtained from equation 7 is in excellent agreement with the experimental value calculated from the dependence of BSF length on density.

The agreement between the results of Equation 5 and Equation 7 suggests that the mechanisms assumed to describe precipitation of oxygen in the experiment are valid. Combining equations 5 and 7, a relation between BSF size and BSF density, which is only dependent on precipitated oxygen, is obtained:

$$D = 1.25 \pi C_i \Delta O_i / 8_{\overline{w}}^2 \qquad [8]$$

This expression enables the BSF density (D) to be calculated knowing the amount of oxygen precipitated, and BSF size. Of course, D is determined by the number of nuclei whose size, obtained during nucleation, is above the minimum size for growth at precipitation temperature.

Figure 10:
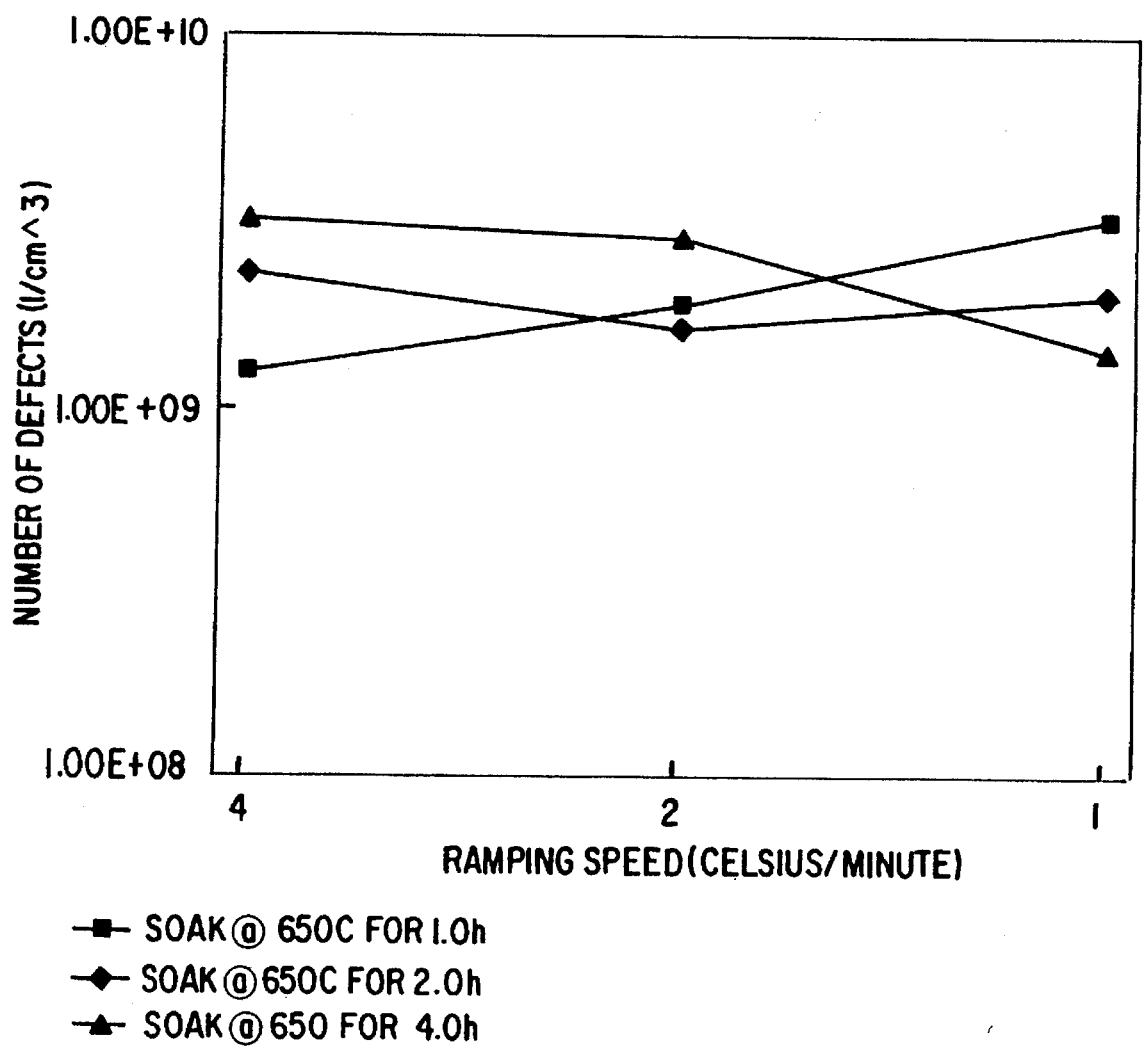
FIG. 10 shows the number of defects per unit volume for different combinations of nuclear growth cycles with ramping to 900° C.
Figure 11:
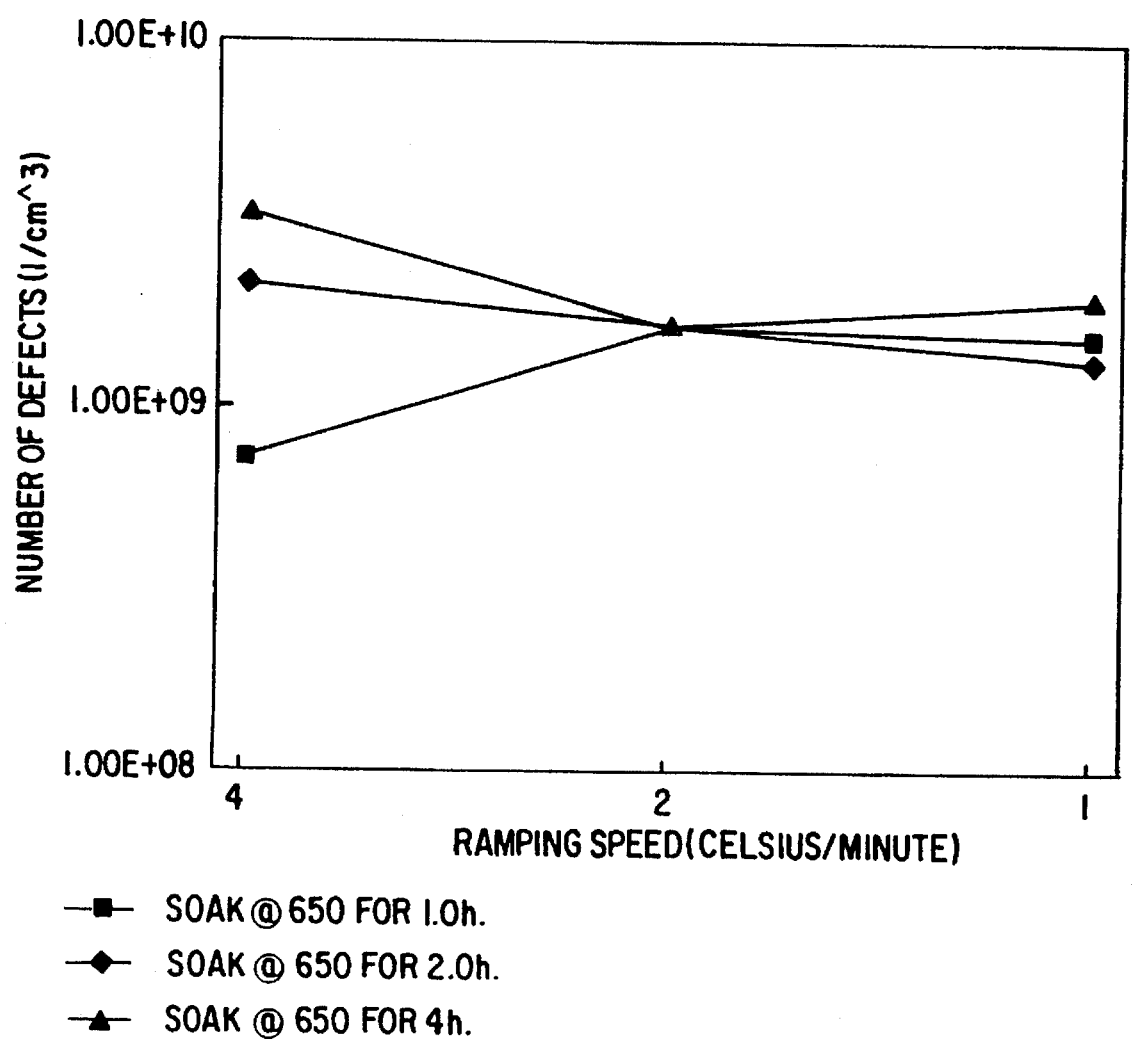
FIG. 11 shows the number of defects per unit volume for different combinations of nuclear growth cycles with ramping to 1000° C.
Figure 12:
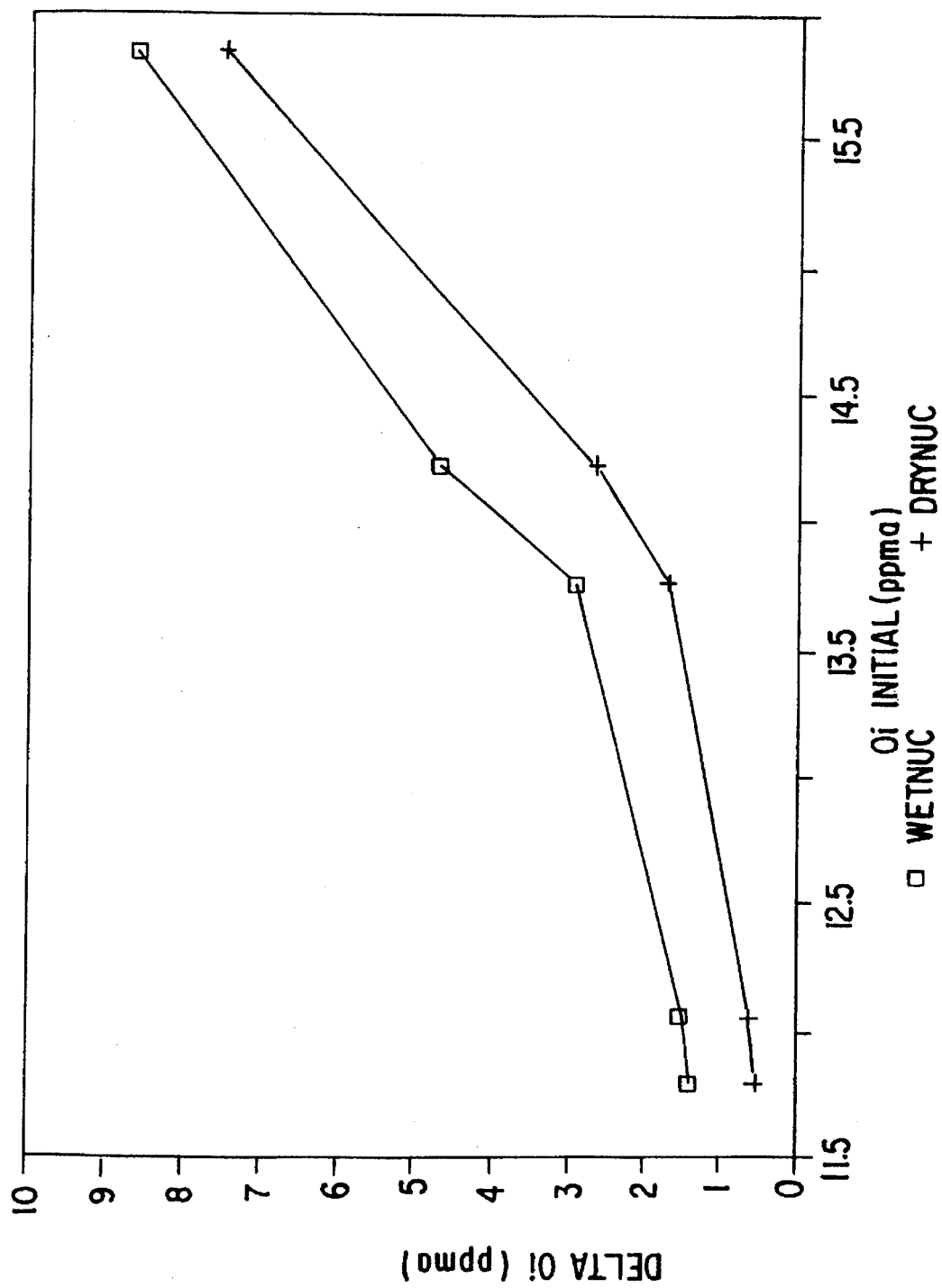
FIGS. 12 and 13 show the precipitated interstitial oxygen (DELTA $O_i$) as a function of initial $O_i$ for high oxygen epitaxial wafers and bulk wafers.
Figure 13:
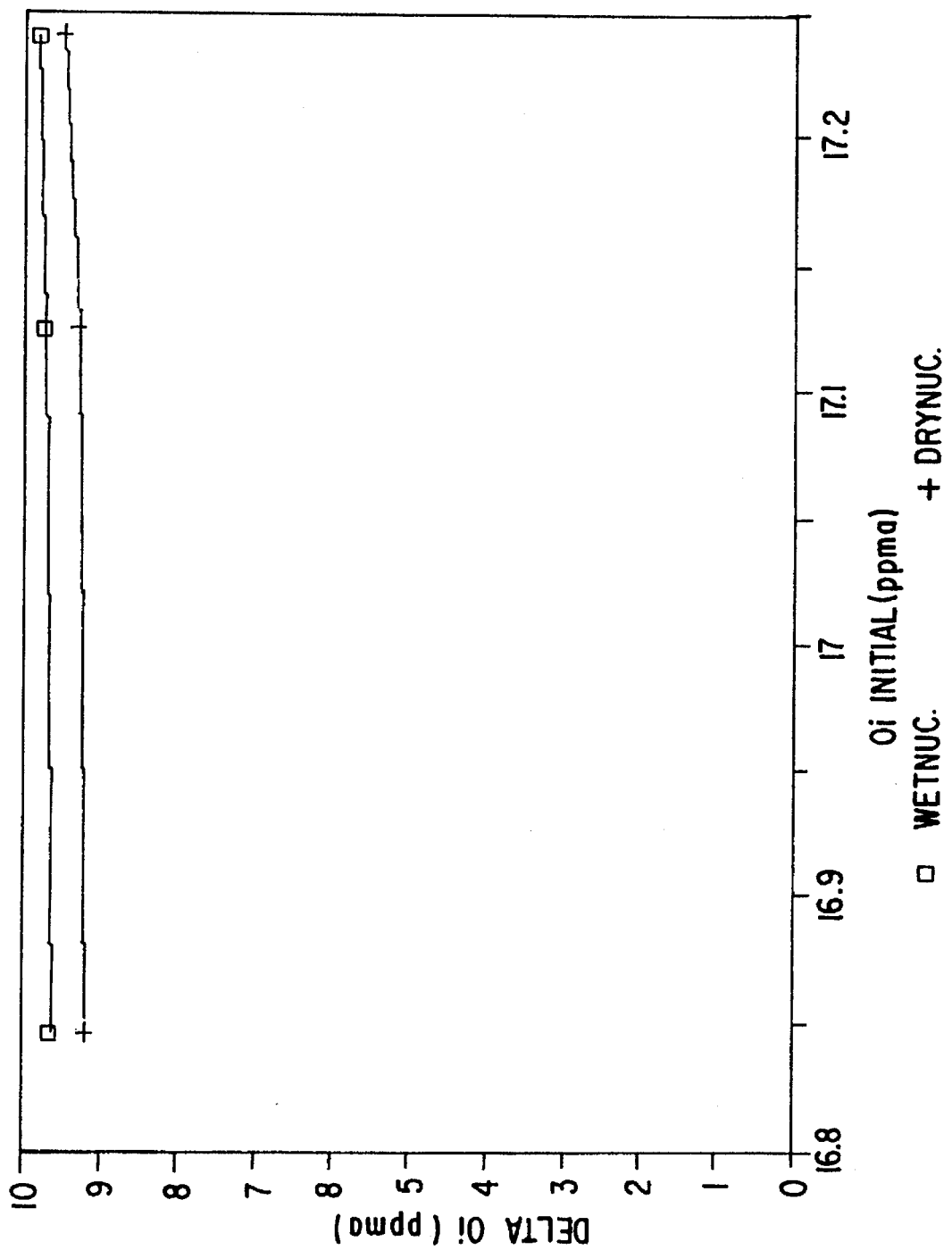

FIGS. 10 and 11 show the volumetric density of the small defects that are seen on high magnification pictures. The same wafers as for FIGS. 7 and 8 were used. The density of small defects is about 10 times higher than the BSF density, and it varies less between splits. It also appears that the small defect density is somewhat proportional to soak time.

Ramping up to 900° C. or 1000° C. does not make much difference in the density of small defects either, except when the soak is only 1.0hr. In this case, the density of small defects increases with slower ramping rates, in agreement with oxygen precipitation data. This tendency is the opposite of what is observed for BSF density. From this observation, it appears that the small defects are oxygen precipitates that did not nucleate a BSF during well diffusion.

From the observation that most of the small defects (oxygen precipitates) grow during field oxidation, it is interesting to ask how did oxygen nuclei survive the well drive (1175° C.) since interstitial oxygen is strongly depleted (compared to the case where no BSF grow) after the well drive. One possible answer is that interstitial silicon depletion during well drive allows nuclei of smaller size than normal to survive. These nuclei, or precipitates, can then grow during field oxidation.

Because the mechanical strength of the wafers decreases as interstitial oxygen concentration decreases, it is possible that wafers warp during thermal processing. To ensure that the enhance oxygen precipitation does not cause this, bow was measured on all wafers. In all the cases the processing induced bow was found to be less than 2 microns. Of course this measurement is of limited use because the normal process was not exactly followed. In particular most of the bow occurs after the field oxidation because of the nitride left on the back of the wafer, and nitride was not used in this experiment. However it has been shown that nitride deposition does not significantly affect wafer bow.

Because $Si_I$ is a by-product of oxygen precipitation, depletion of $Si_I$ from the bulk caused by the high density of BSF favours oxygen precipitation. This means that BSF density and size control the oxygen precipitation rate along with supersaturated interstitial oxygen concentration.

The interaction between dislocations and oxygen precipitation has been noted before. In particular, high pressure crystalline SiO$_2$ polymorphs (coesite) has been observed in the form of small ribbons (25) along <110>dislocations. It has also been observed that crystalline phases of SiO$_2$ are favoured by the presence of dislocations, probably because of the high hydrostatic pressure around dislocations. The presence of high density of BSF, in the results presented here, explains why high levels of oxygen precipitation are observed in highly antimony doped substrate.

When BSF density (D) is high enough to affect BSF size, the mean free path of silicon interstitial is strongly reduced. Since fast metallic contaminants diffuse similarly to silicon interstitials' they too should be captured by BSF during cool down and see their mean free path reduced. Therefore good gettering is expected when the BSF length is affected by the BSF density.

To confirm the improved gettering of epitaxial wafers using NG, a lot of 21 wafers was processed with NG (9 wafers) and without NG (12 wafers) On each finished waters capacitors (8 sites) and diode integrity (5 sites) was checked.

Capacitors (2,500,000 µm$^2$) were measured for leakage at 10 volts in accumulation (n- and p-substrates). A capacitor was considered short if a current greater than 30 nA was measured. The breakdown voltage of n+/p– diodes (185,000 µm$^2$) was measured at 1.0 pA. For the diodes the fail criteria was a breakdown voltage below or equal to 21 Volts. The process used here usually gives n+/p– diode breakdown voltage of 23 Volts.

Table 3 presents the results obtained.

TABLE 3

Capacitor and diode integrity test results
2.0 hr. and 2.0°/05 n. Ramp to 900° C.

| Parameter | Without NG | With NG |
|---|---|---|
| Gate oxide leakage >30 nA | 122.5 | 182.5 |
| N+/p– diode breakdown <21 V | 185.0 | 245.0 |

The improvement in gettering is measurable. The use of NG has eliminated the occurrence of contamination induced n+/p– junction soft-breakdown, and has reduced by about an order of magnitude the density of gate oxide shorts. Even considering the limited number of measurement sites and wafers used the improvement is significant.

In summary, several nucleation cycles were experimented with after an initial oxidation on N/N+ antimony doped substrates. All these cycles show significant improvements in oxygen precipitation. The cycle which provides the optimum ratio of precipitation to extra furnace time consists of 2 hrs at 650° C. in N2 with a ramp-up to 900° C. at a rate of 2.0° C./min. (total extra time =245min.). Total oxygen precipitation obtained with this nucleation was about 9.0 ppmA for wafers with 16.0 ppmA of initial interstitial oxygen content.

Significant improvements in oxygen precipitation and in density of bulk defects show that nucleation-growth process does improve the effectiveness of oxygen precipitation. This in turn should greatly improve internal gettering in wafers.

Fully processed wafers with and without ramp nucleation were tested for gate oxide and n+/p–junction integrity. For both electrical measurements a observed, confirming the very significant improvement could be achieved with ramp nucleation.

EXAMPLE 2

Studies were carried out on the feasibility of nucleation process standardization for epitaxial and bulk material for a three micron process and the standardization of nucleation process for two micron process with Poly back sealed and HIOX epitaxial wafers.

A batch (E9-8) consisting of 42 prime wafers was processed in according to the process flow in FIG. 1. Bulk and high oxygen content epitaxial wafers (epi HIOX) were used for the 3 micron front end. Polysilicium back sealed (PBS) and epi HIOX wafers were used for the 2 micron front end. The wafers per material per split were used at all times. Except for PBS, wafers had respectively 15, 16 and 17 ppma of initial interstitial oxygen content (Oio). Oio in PBS wafers is not known.

Oxygen content was measured on bulk and epi HiOX wafers before processing, after initial oxidation, p-well diffusion, and field oxidation. Oxygen content in PBS wafers cannot be measured because infrared absorption caused by higher antimony doping (10–20 mΩcm compared to 30–50 mΩcm) is too important. In this case, PBS wafers from a single box were used for all PBS splits.

In this experiment, it was decided to leave nitride on the back of the wafers during field oxidation. This enables a realistic evaluation of wafer warp during field oxidation. It is also possible that tension caused by the nitride film affects density and size of oxygen precipitates growing during field oxidation. Mechanical stress may also affect the size of BSF, but should not affect their density since they are formed during p-well diffusion.

Wafer bow was measured by laser interferometry (Tropel instrument), before processing, and after field oxidation was completed and all oxide layers removed.

FIG. 14 graphically presents the splits done at initial oxidation, nucleation, and soak. Split D is expected to be the best compromise for high bulk defect density (BDD) bulk and epitaxial wafers for 3 micron process. Split A is thermally equivalent to what was already experimented.

Split D provided high BDD on epitaxial wafers. In ref. 1 no soak was done to shrink OSF. P-well diffusion, just like the soak, is done at 1175° C. following initial oxidation.

Split B, C and D are an attempt to generate BSF during initial oxidation. This would provide important internal gettering available during mask 10. However, for splits B and C, nucleation without first denuding is risky for DZ depth, if oxygen precipitates do not dissolve at 1175° C.

The table shows the experimental processing for this batch. An X indicates the step was carried out. Two micron field oxides were used on split E, F, and G.

| SPLIT | A | B | C | D | E | F | G |
|---|---|---|---|---|---|---|---|
| epi PBS | | | | | X | X | X |
| epi HIOX | X | X | X | X | X | X | X |
| Bulk | X | X | X | X | | | |
| nucleation | | X | X | | | | X |
| ion 2 µm | | | | | X | X | X |
| ion wet | | X | X | X | | | |
| ion CHI | X | X | | | | | |
| nucleation | X | | | X | | X | |
| soak | | | X | X | | | |
| oxide etch | X | X | X | X | X | X | X |
| p-well dif. | X | X | X | X | X | X | X |
| oxide etch | X | X | X | X | X | X | X |
| subnitox | X | X | X | X | X | X | X |
| nitride dep. | X | X | X | X | X | X | X |
| nitride etch | X | X | X | X | X | X | X |
| field oxide | X | X | X | X | X | X | X |
| oxide etch | X | X | X | X | X | X | X |
| nitride strip | X | X | X | X | X | X | X |
| oxide etch | X | X | X | X | X | X | X |

This process does not use a denuding cycle. The initial oxide is thin (200A) and is grown at low temperature (9500° C.). However, it is believed that this process can be adapted to internal gettering with epitaxial HiOX material.

Once the wafers were fully processed, they were cleaved and one half of each wafer had a Weight etch for 1.0 minute.

This preferential etch reveals OSF, BSF, dislocation, and precipitates, on the surface and on the wafer section. Bulk defects were then counted and their length measured.

Precipitation in bulk wafers is different from in epitaxial wafers. In particular, very much reduced precipitation was observed in epitaxial wafers during field oxidation (1000° C.), even with nucleation.

Figure 17:
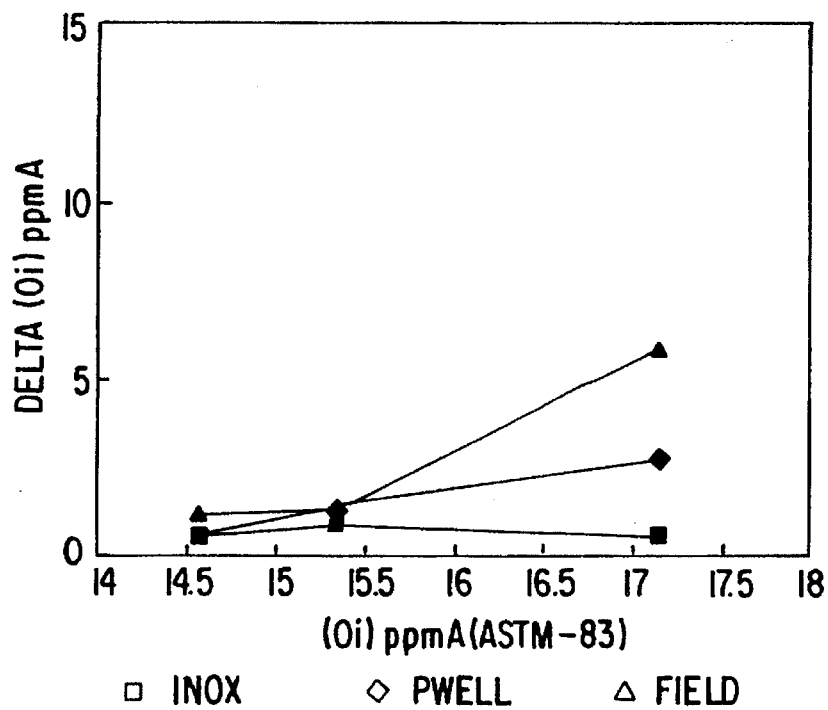
FIG. 17 Precipitated interstitial oxygen (DELTA $[O_i]$) for epitaxal wafers with nucleation after HCl initial oxidation as a function of intiw [Oi]

Standard CHL initial oxidation with nucleation before (split A: FIG. 16 and 17), or nucleation after (split B: FIG. 5 and 6) gave results very much different from each other. Precipitation is much better with nucleation done before HCl initial oxidation for bulk materials. Yet, precipitation in epitaxial wafers is not very good in split A and in split B.

This is an interesting result. For one thing, it confirms the last experiment that spending too much time at 1175° C. causes precipitation to be inhibited on bulk and on epitaxial materials (split A). What is observed in split B is that precipitation on epitaxial wafers is also degraded when wafers do not spend any time at 1175° C. before nucleation. This clearly demonstrates the presence of an optimum time to be spent at 1175° C. before nucleation, to get maximum
precipitation in epitaxial wafers during p-well diffusion.

Figure 18:
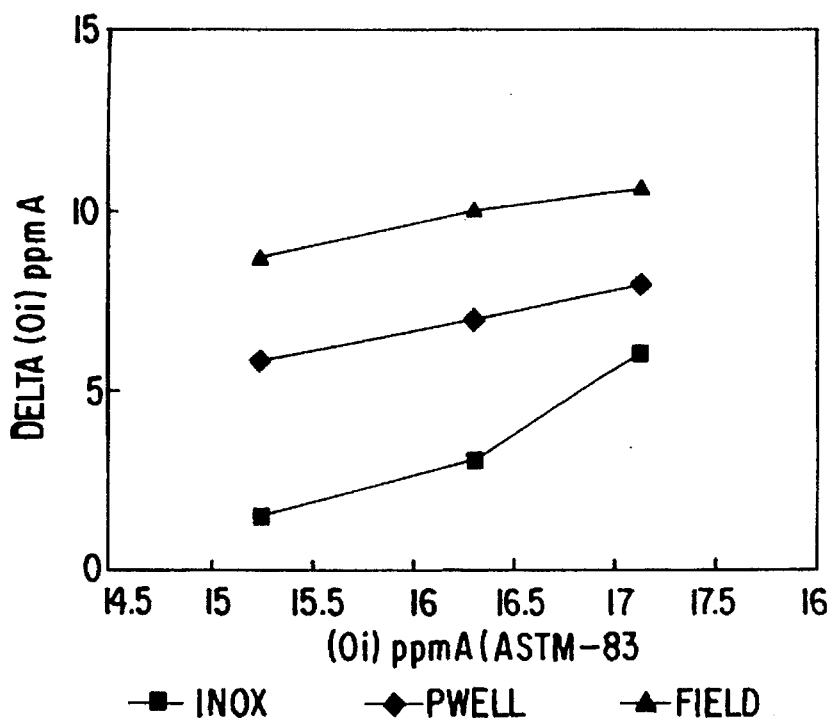
FIG. 18 shows precipitated interstitial oxygen (DELTA [Oil) for bulk wafers with nucleation before HCl initial oxidation as a function of initw [Oi]
Figure 19:
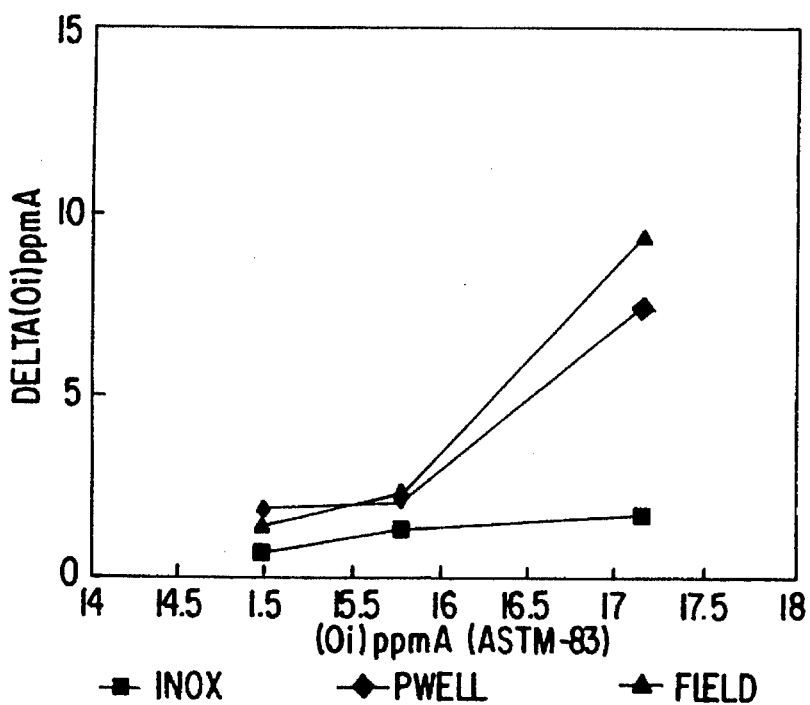
FIG. 19 shows precipitated interstitial oxygen (DELTA [Oil) for epitaxial wafers with nucleation before HCl initial oxidation as a function of initial [oil]

In FIG. 18, bulk wafers show precipitation right after initial oxidation. This indicates gettering capability just after the first thermal cycle for wafers with Oio above 15 ppma. Gettering at this step helps decrease the density of OSF growing during p-well diffusion. It also helps to getter contaminants induced during mask 10.

Figure 20:
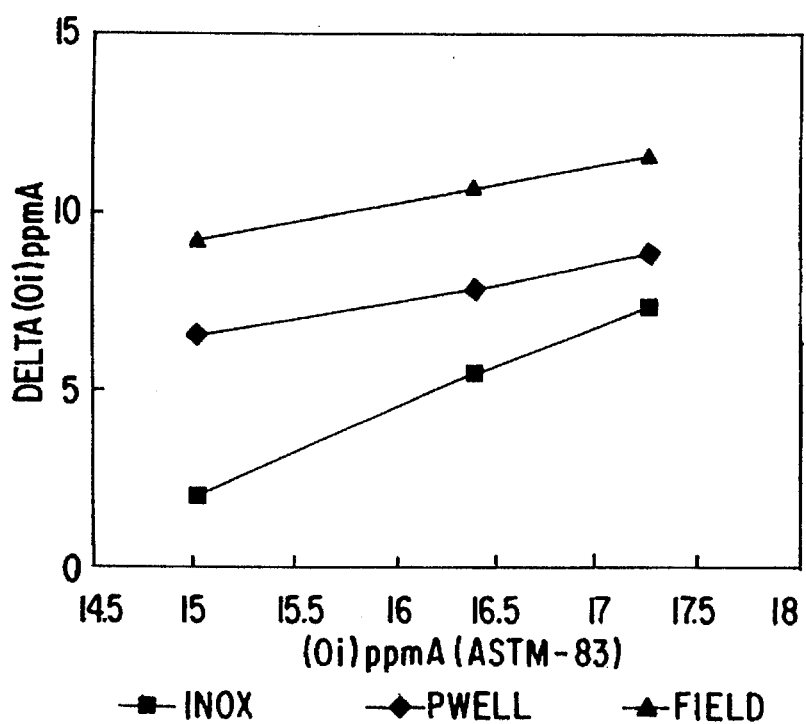
FIG. 20 shows precipitated interstitial oxygen (DELTA [Oil) for bulk wafers with nucleation before wet initial oxidation as a function of initial [Oi]
Figure 21:
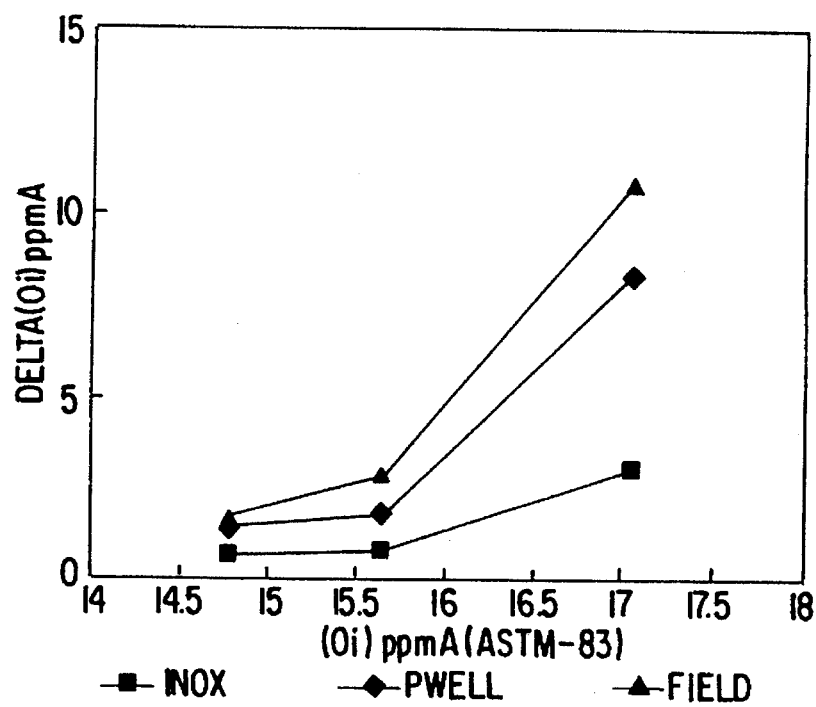
FIG. 21 shows precipitated interstitial oxygen (DELTA [Oi]] for expitaxial wafers with nucleation before wet initial oxidation as a function of initial [Oi]

Split C (FIGS. 20 and 21) gave results nearly identical to split B for both materials. This important similarity shows that presence of CHL during initial oxidation does not affect precipitation of interstitial oxygen.

Similarity between the results in FIG. 16 and the results obtained with wet initial oxidation and soak done before nucleation, also confirms the little impact that HCl ambient has on nucleation or precipitation. This is an unexpected conclusion since CHL oxidation increases denuded zone (DZ) depth, and a detrimental effect was expected on nucleation at least.

Levels of precipitation obtained on bulk material for split B and C are very high. Typically about 6 ppmA of interstitial oxygen is left in wafers after field oxidation. Without nucleation, about 14 ppma of interstitial oxygen remains in solution in bulk wafers. Bulk wafers from split C, like in split B, also show important precipitation during initial oxidation.

Figure 22:
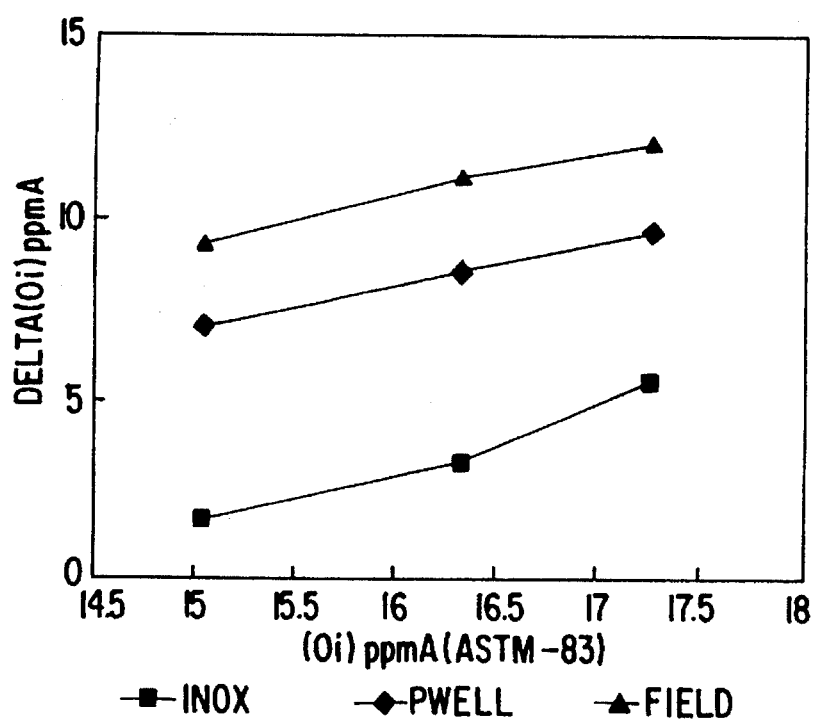
FIG. 22 shows precipitated interstitial oxygen (DELTA [Oil] for bulk wafers with nucleation after wet initial oxidation but before soak, as a function of Oio.
Figure 23:
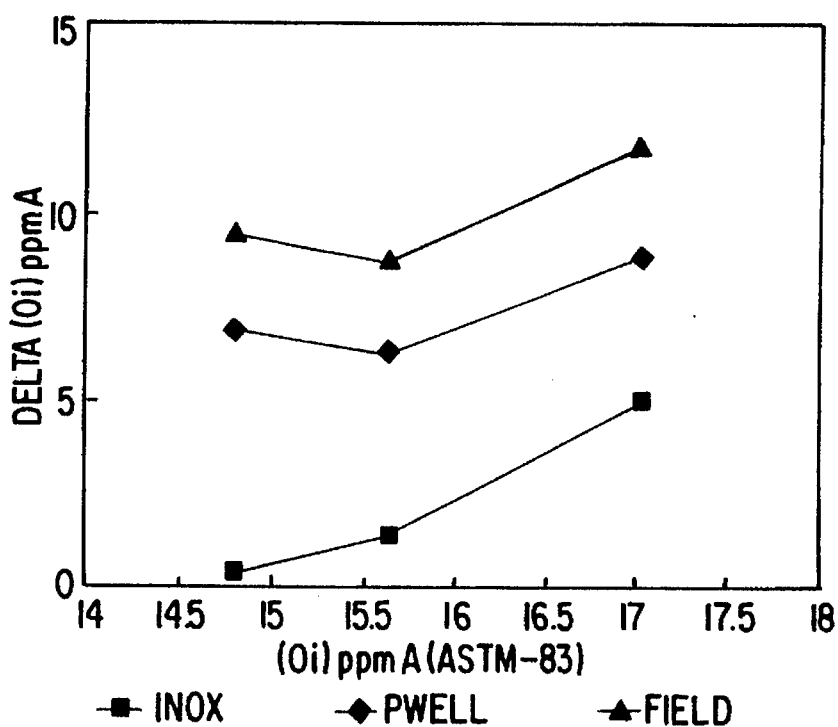
FIG. 23 shows precipitated interstitial oxygen (DELTA [Oil] for epitaxial wafers with nucleation after wet initial oxidation but before soak, as a function of Oio.

Confirmation is given by split D (FIG. 21 and 22) that there exists an optimum time to be spent at 1175° C. for maximum precipitation in wafers (FIG. 23). For this Split, epitaxial wafers exhibit levels of precipitation comparable to those obtained on bulk wafers. Bulk wafers also show maximum precipitation, but the maximum is not as pronounced as for epitaxial wafers.

Furthermore, precipitation level after field oxidation in epitaxial wafers is comparable to precipitation in bulk wafers. Because epitaxial wafers are not expected to precipitate more than bulk wafers, this indicates that time spent at 1175° C. during wet initial oxidation (34 min.) is close to optimum time.

This result shows that the same front end can be used for epitaxial and for bulk wafer on 3 micron to achieve high oxygen precipitation, and thus good gettering.

Figure 25:
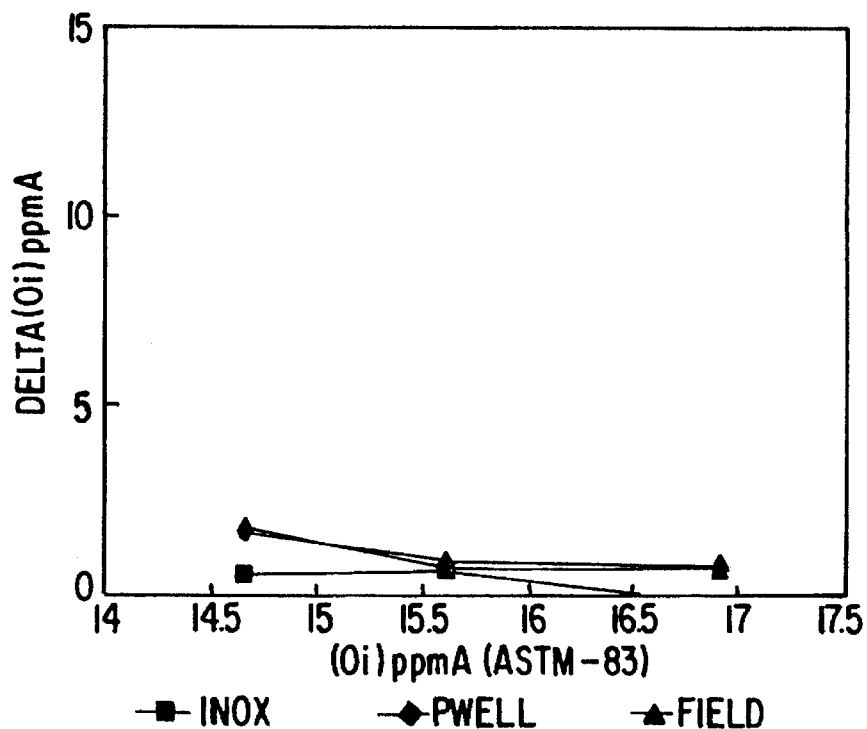
FIG. 25 shows precipitated interstitial oxygen (DELTA [0i]) for epi HiOX wafers with 2 pm initial oxidation as a function of initial [Oil]

FIG. 25 illustrates the dependence of precipitation versus time spent at 1175° C. before nucleation, for epitaxial and bulk wafers. The peek in precipitation is probably narrower than shown in FIG. 25 for epitaxial wafers. One possible cause for the difference between precipitation in epitaxial wafers and in bulk wafers is the epitaxial layer deposition which is done at about 1150° C. But this does not explain why nucleation needs to be activated first for epitaxial wafers only.

The rather different behaviour of epitaxial wafers raises question as to the compatibility of wafers from different suppliers. Because wafers from different suppliers may have seen different thermal processing, they may not be process compatible. Epitaxial wafers from Wacker Siltronics were used in this experiment.

Figure 26:
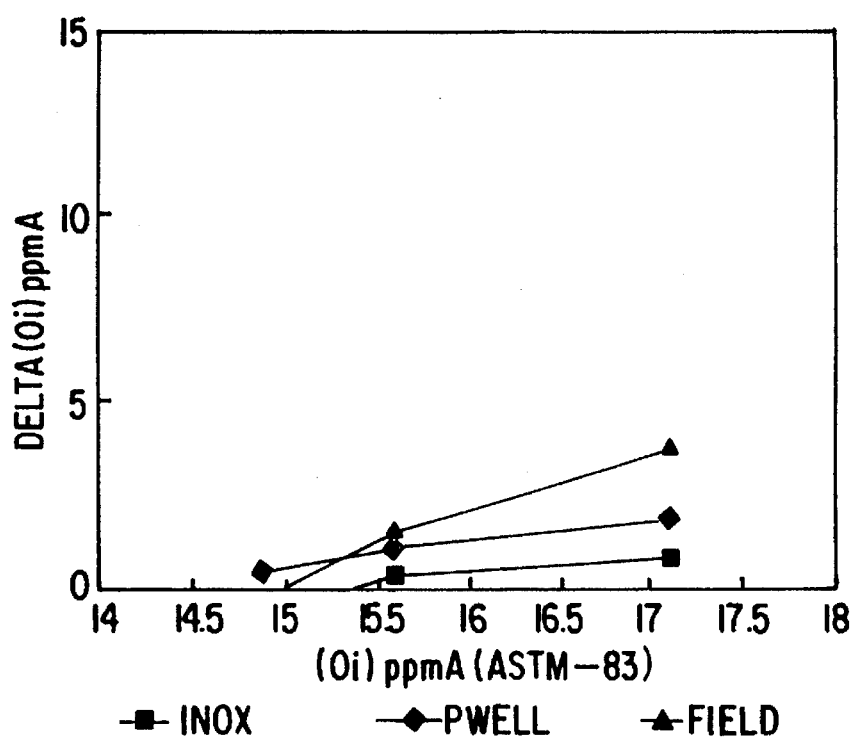
FIG. 26 shows precipitated interstitial oxygen (DELTA [0i]) for epi HIOX wafers with nucleation after 2 pm initial oxidation as a function of initial [0i]

Internal gettering in the two micron process is hard to get using actual initial oxidation at 950° C. FIG. 26 shows that no oxygen precipitation occurs in epitaxial HIOX wafers for initial oxygen content below 17 ppma. This explains why two micron process gives better oxides and diodes with PBS wafers. This result also indicates that no internal gettering occurs in PBS wafers (oxygen content is below 17 ppma).

Currently, the two micron process does not make use of internal gettering. Because poly back coating has limited volume and recrystalizes at high temperatures, gettering capacity is smaller than the case of internal gettering. This probably accounts for the not so good gate oxide integrity of the two micron process.

Figure 24:
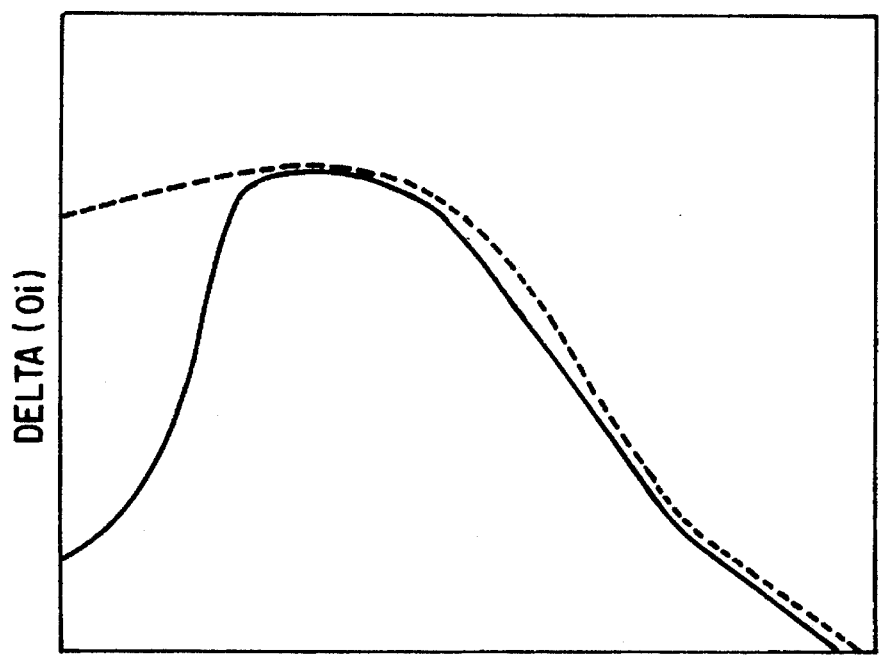
FIG. 24 shows the probable dependence of precipitation on time spent at 1175° C. as deduced from results of this experiment; the line is for epitaxial wafers, the broken line is for bulk.
Figure 27:
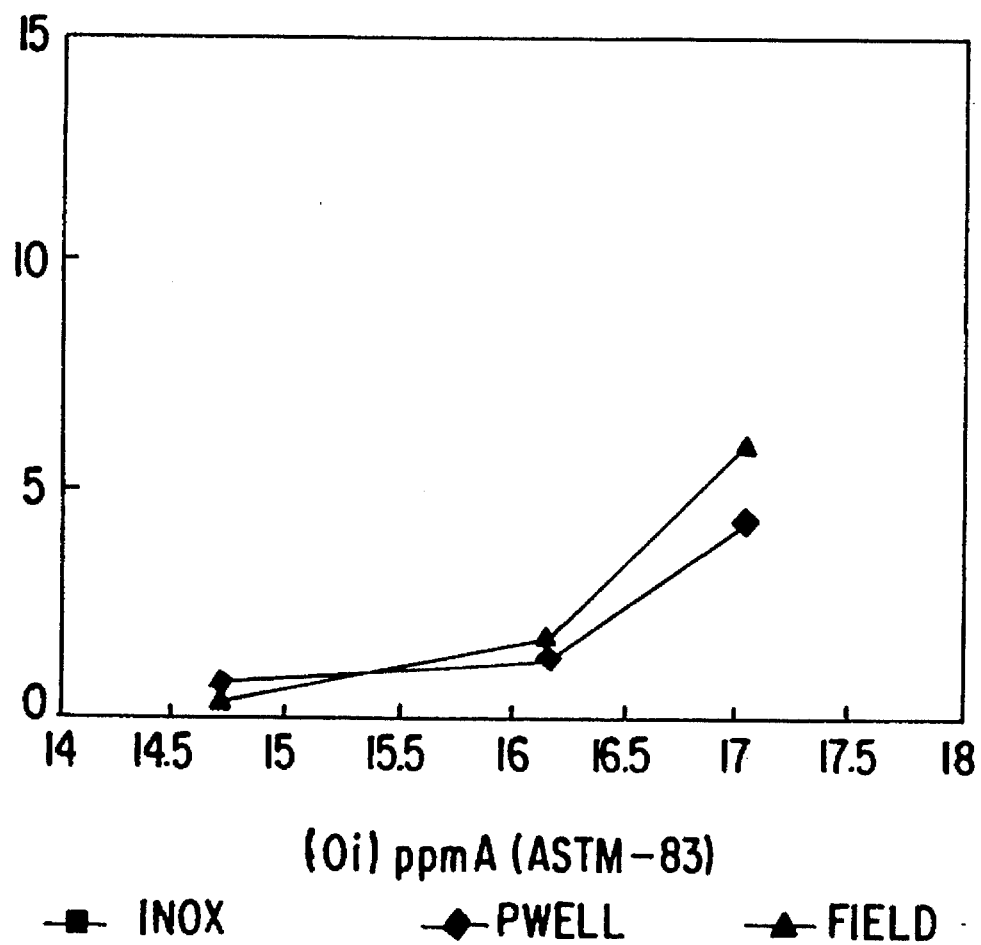
FIG. 27 shows precipitated interstitial oxygen (DELTA [0i]) for epi HIOX wafers with nucleation before 2 pm initial oxidation as a function of initial [Oil.
Figure 28:
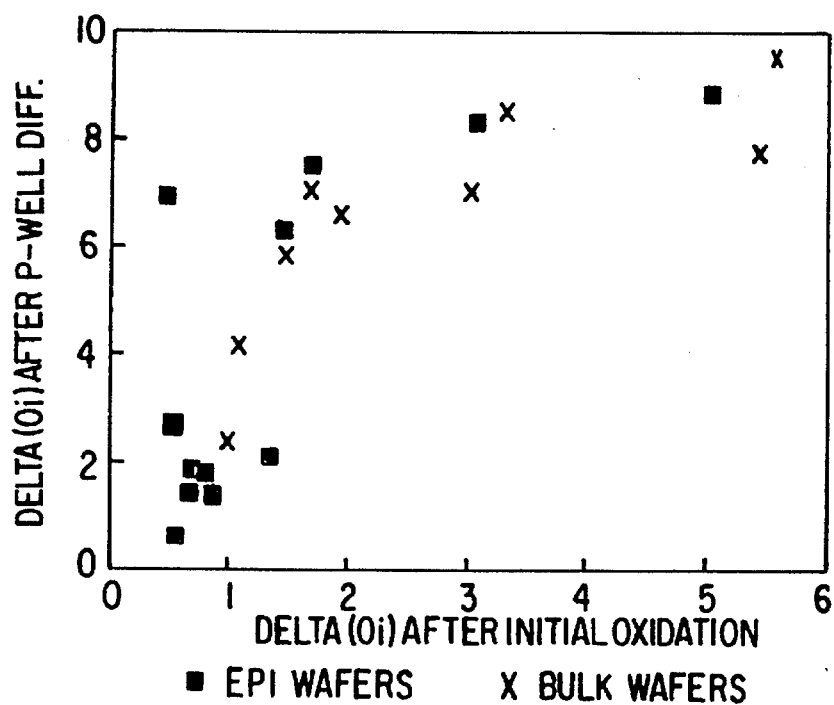
FIG. 28 shows precipitated interstitial oxygen after p-well diffusion as a function of precipitated oxygen after initial oxidation for epi I-liOX wafers (box) and for bulk wafers (cross) (3 micron process)

The addition of a nucleation cycle after (FIG. 27) or before 2 µm initial oxidation (FIG. 28) markedly improves oxygen precipitation above 16 ppma. But levels of precipitation achieved are well below those possible in HIOX epitaxial wafers on the 3 µm process (FIG. 24).

Internal gettering for two micron process is possible if 30 minutes at 1175° C. (in nitrogen) are inserted between initial oxidation and nucleation. This would provide BSF generation during the P-well diffusion. To have gettering capability during mask 10, a soak should be added after nucleation, adding another 175 minute plus ramp time.

Figure 29:
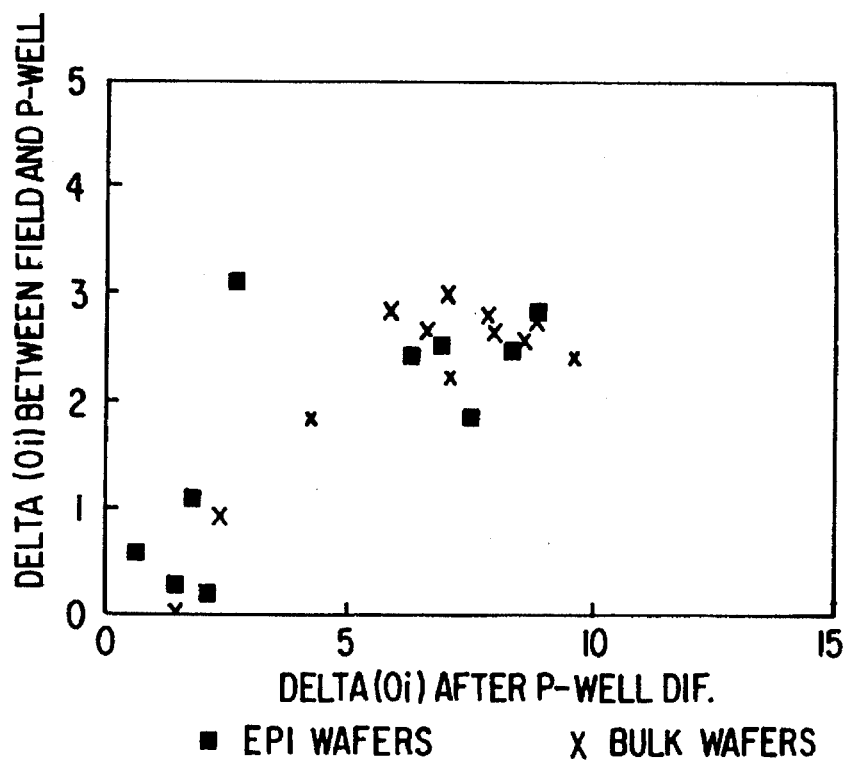
FIG. 29 shows bulk defects and denuded zone of epitaxial wafers with HCl initial oxidation followed by nucleation (split A). Scale is 22OX. Denuded zone depth is about 65 pm. Wafer's surface is at the left.

FIG. 29 shows that precipitation evolution during p-well diffusion is identical for both epitaxial and bulk wafers. As indicated in FIG. 25, nucleation is just more difficult to get started with epitaxial
wafers. This is valuable additional information on precipitation dynamics.

The amount of precipitated oxygen after p-well diffusion is a maximum when more than 1 ppma of oxygen has precipitated during initial oxidation for both materials (FIG. 29).

Saturation observed in FIG. 15 indicates that interstitial oxygen concentration is very close to oxygen solid solubility limit at 1175° C. After p-well diffusion only 7.5–8.0 ppma of oxygen was left in wafers with most precipitation.

The solubility limit for oxygen in silicon at 1175° C. is 6.2 ppma. The narrow difference between the concentration of oxygen in solution and the oxygen solubility limit must considerably slows down the precipitation reaction (supply limited reaction).

Oxygen precipitating at 1175° C. generates a very significant number of BSF. This makes the wafers (bulk and epitaxial) from split D most attractive for internal gettering by BSF.

Small defects, though to be oxygen precipitates, grow during field oxidation (1000° C.). The presence of these oxygen precipitates is also an important internal gettering agent, because of their high densities ($10^9 cm^{-3}$). Their number is expected to be somewhat proportional to the extra oxygen precipitating during field oxidation oxygen precipitating during field oxidation determines the extend of the denuded zone (DZ).

Figure 30A:
FIG. 30 shows bulk defects and the denuded zone of epitaxial wafers with HCl initial oxidation followed by nucleation (split A). Scale is 22OX. The denuded zone depth is about 65 pm. The wafer's surface is at the left.
Figure 30B:
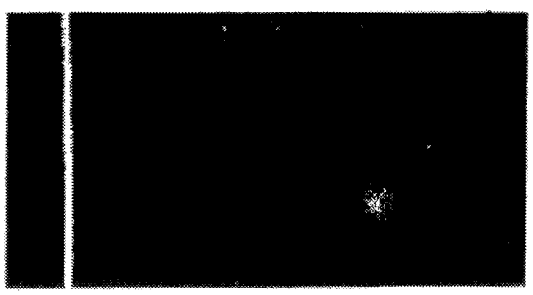
Figure 30C:
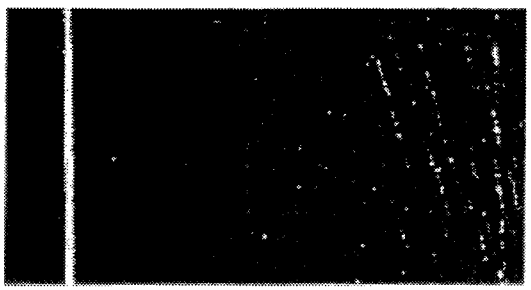

FIG. 16 shows extra oxygen precipitation during field oxidation as a function of oxygen precipitated during p-well. It can be observed that there is saturation in precipitated oxygen during field oxidation at about 2.5 ppma when 5.0 ppma of oxygen, or more, has precipitated during p-well diffusion. Again in FIG. 30, epitaxial wafers follow bulk wafer's behaviour very closely.

It is interesting to note that when more than 1 ppma of oxygen precipitates during initial oxidation then, more, than 5.0 ppma precipitates during p-wen, and about 2.5 ppma precipitates during field oxidation. This is a pretty impressive leverage effect.

Figure 31A:
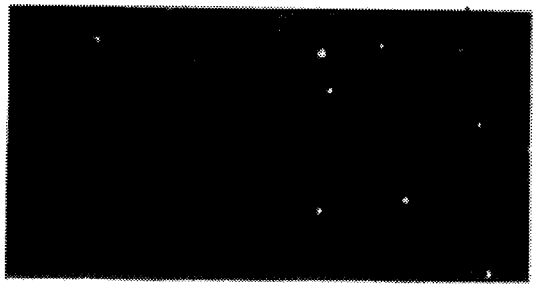
FIG. 31 shows bulk defects and denuded zone of bulk wafers with HCl initial oxidation followed by nucleation (split A). Scale is 22OX. Denuded zone depth is about 351 mn. Wafer's surface is at the left.
Figure 31B:
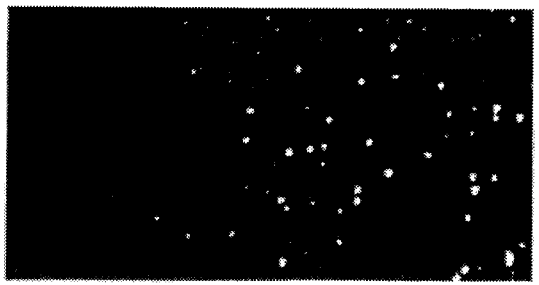
Figure 31C:
Figure 32A:
FIG. 32 shows bulk defects and denuded zone of epitaxial wafers with nucleation followed by HCl initial oxidation (split B, identical to C). Scale is 22OX. Denuded zone depth is about 30 μm. Wafer's surface is at the left.
Figure 33A:
FIG. 33 shows bulk defects and denuded zone of bulk wafers with nucleation followed by HCl initial oxidation (spht B, identical to C). Scale is 22OX. Denuded zone depth is about 1 opm. Wafer's surface is at FIG. 34 show bulk defects and denuded zone of epitaxial wafers with wet initial oxidation followed by nucleation and soak (split D). Scale is 22OX. Denuded zone depth is about 25;im. Wafer's surface is at the left
Figure 32B:
Figure 33B:
Figure 32C:
Figure 33C:

Oxygen precipitates (OP) and the defects often associated with them, namely bulk stacking faults (BSF) and dislocations, were observed to different extent in the wafers. As shown from FIG. 16 and 17, wafers from split A showed the lowest number of OP and BSF (FIG. 31 and 32). OP can be easily identified on FIG. 31 as the little craters; BSF are the lines at a 600 angle from the surface (family of 1 1 1 planes).

FIG. 32 is good example of the effect of increasing oxygen content on oxygen precipitation. The onset of precipitation in FIG. 18 is about 16 ppma and is in good agreement with the onset in ΔOi observed in FIG. 16.

Wafers in FIG. 31 and 32 (CHL initial oxidation followed by nucleation) would not show good gettering ability because of the small density of OP and because of the absence of larger defects (BSF).

OP appear smaller in epitaxial wafers (FIG. 31). It is not clear yet if this is real or is an etch artifact caused by the low substrate resistivity. Only TEM could confirm precipitates size and shape in S epitaxial material.

The denuded zone is clear for all wafers in FIG. 31 and 32. This is not surprising, taking into account the rather attenuated precipitation observed.

Figure 34A:
Figure 34B:
Figure 34C:

Much higher OP and BSF densities are observed on bulk wafers with nucleation followed by CHL initial oxidation (FIG. 34). The density observed in this case is quite sufficient for good gettering. Unfortunately, epitaxial wafers, with similar processing, did not show oxygen precipitation for Oio below 17ppmA.

Wafers from split C are not show here because they gave results identical to split B.

Epitaxial and bulk wafers from split D have shown high levels of oxygen precipitation (FIG. 23 and 24)

Figure 35A:
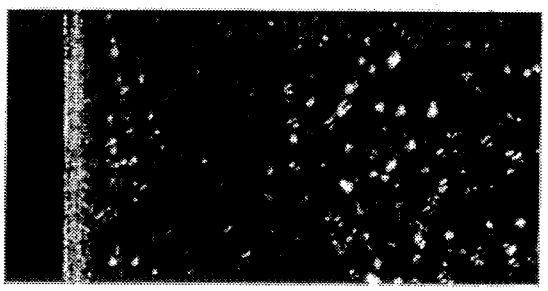
FIG. 35 shows bulk defects and denuded zone of bulk wafers with wet initial oxidation followed by nucleation and soak (split D). Scale is 22OX. Denuded zone depth is about 20 pm. Wafer's surface is at the left.
Figure 35B:
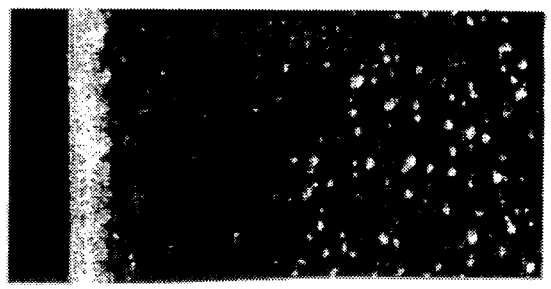
Figure 35C:

In agreement with the oxygen content variation, bulk defect density in those wafers is very high (FIG. 35 and 36), including for epitaxial wafers.

Denuded zone in those wafers is rather thin (20–25 μm), but it is clean. Since the deepest structures extends at most 7 μm deep (5 μ process p-well), the denuded zone is expected to be quite sufficient.

A narrower DZ is an advantage for latchup and ESD protection because of the very much reduced minority carrier lifetime below the DZ. OP and BSF are crystallographic defects, thus act as recombination centres; even if they are not decorated with metallic impurities.

In fact with a DZ of about 20 μn, it is possible to expect latchup free devices on bulk wafers. Such beneficial effect on latchup has already been observed with nucleation (800° C./4h.) on bulk material. This nucleation cycle was not merely as effective as the one use here Bulk defects for wafers used with two micron process are not shown here. Essentially no OP and BSF are seen on HiOX epitaxial wafers. None what so ever, where seen in PBS epitaxial wafers.

However PBS wafers were systematically free of OSF (Table 2). This indicates the advantage of PBS material, that is, gettering capability from the first processing step. Other splits with relatively low OSF densities were split B and C. In this case, nucleation before initial oxidation probably made gettering more efficient at the beginning on the pwell diffusion.

Wafers from split D had the highest OSF density, although this result is comparable to current process capability. It is still possible that the 140 minutes soak at 1175° C. was not sufficient to shrink OSF grown during wet initial oxidation.

Two conditions are required for OSF to occur: first, surface nucleation sites (not necessarily oxygen nucleation); second, oxidation to generate interstitial silicon atoms. Surface nucleation sites control density of OSF. Oxidation rate controls growth. At temperatures above 1 1500° C. retrogrowth of OSF occurs. Variation in OSF density observed are a reflection of variation in surface nucleation sites density. This is why gettering at the beginning of p-well diffusion is so important, and explains why PBS wafers are so good for low OSF density. It probably accounts for the lack of n+/p− junction soft breakdown in the two micron process.

TABLE 2

Proportion of wafer surface covered with oxidation induced stacking faults (OSF). Average of 3 wafers.

| SPLIT | EPI HIOX | OSF proportion BULK | PBS |
|---|---|---|---|
| A | 0.05 | .38 | |
| B | 0.00 | 0.05 | |
| C | 0.13 | 0.07 | |
| D | 0.27 | 0.15 | |
| E | 0.40 | | 0.00 |
| F | 0.33 | | 0.00 |
| G | 0.04 | | 0.00 |

For all wafers, but PBS, the variation in bow induced during processing was about I micron on average after field oxidation. This is merely the detection limit (fringes set at 2 microns). This bow is not believed to be significant. PBS wafers showed a bow about 10 microns lower than as received. The change in bow is caused by relaxation of the poly layer on back of the wafer, and also to the removal of the SPLTO oxide on top of the polysilicon. In all cases the absolute bow was below 25 microns The above experiments demonstrate that processed HiOX epitaxial and bulk wafers showed high density of bulk stacking faults (BSF). Bulk wafers showed very high density of large oxygen precipitates known to grow during field oxidation.

The denuded zone of split D wafers extended to about 20–25, am, and was clean. This is excellent for reducing latchup.

Doing nucleation before the three micron initial oxidation (split B and C) yielded poor denuded zone, as expected. Epitaxial wafers processed this way also showed little precipitation for oxygen content below 17 ppma, therefore are not interesting.

The very different behaviour of epitaxial wafers has been demonstrated. to require activation first (at 1175° C.) before nucleation is possible.

For the two micron process, poly back sealed epitaxial wafers (PBS) showed no OSF on the surface as opposed to HIOX epitaxial wafers. In all cases studied, no significant oxygen precipitation was observed below 17 ppma with the two micron initial oxidation.

It appears that PBS inhibits formation of OSF by gettering stacking faults nucleation sites. It is also evident from our results that two micron initial oxidation cannot permit oxygen nucleation in HiOX epitaxial wafers (temperature not high enough to activate nucleation).

Presently PBS wafers and HIOX epitaxial wafers have different epitaxial layer thicknesses (respectively 12 and 10 microns); also they have different substrate resistivity (10–20 m$\Omega$m and 30–50 m$\Omega$m).

I claim:

1. A method of preparing a antimony-doped semiconductor wafer with intrinsic gettering capability, comprising consecutively carrying out the steps of:

a) exposing the antimony doped wafer to a wet oxidizing atmosphere at a steady temperature above about 1000° C. for between about 20 to 60 minutes to form an oxidation layer thereon;

b) immediately after step (a) heating said wafer at a steady temperature of between about 600°–700° C. in an inert atmosphere for about 1 to 4 hours to initiate formation of crystal nuclei in the wafer;

c) carrying out a single ramp cycle in said inert atmosphere during which the temperature is ramped up to a temperature of at least about 850° C. at a rate of about 1°–10° C./min. to initiate nucleation growth from said formed crystal nuclei; and d) directly, without an intervening annealing step, carrying out a well diffusion step on the wafer at a temperature of at least about 1000° C. during which oxygen precipitation occurs.

2. A method as claimed in claim 1, characterized in that the ramp rate is about 1°–3° C./min.

3. A method as claimed in claim 1, characterized that the steady temperature is about 650° C.

4. A method as claimed in claim 1, characterized in that the temperature is ramped up to a temperature of about 900° to 1000° C.

5. A method as claimed in claim 1 characterized in that the well diffusion carried out at a temperature of about 1175° C.

* * * * *